(12) United States Patent
Chakrabarty et al.

(10) Patent No.: US 12,346,072 B2
(45) Date of Patent: Jul. 1, 2025

(54) APPARATUSES SYSTEMS AND METHODS FOR OPTIMIZATION-BASED CONTROL OF PHYSICAL SYSTEMS

(71) Applicant: Mitsubishi Electric Research Laboratories, Inc., Cambridge, MA (US)

(72) Inventors: Ankush Chakrabarty, Cambridge, MA (US); Rien Quirynen, Somerville, MA (US); Diego Romeres, Cambridge, MA (US); Stefano Di Cairano, Newton, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 694 days.

(21) Appl. No.: 17/451,336

(22) Filed: Oct. 19, 2021

(65) Prior Publication Data
US 2023/0119664 A1    Apr. 20, 2023

Related U.S. Application Data

(60) Provisional application No. 63/262,626, filed on Oct. 16, 2021.

(51) Int. Cl.
| | | |
|---|---|---|
| G05B 13/04 | (2006.01) | |
| G05B 13/02 | (2006.01) | |
| G06F 30/27 | (2020.01) | |

(52) U.S. Cl.
CPC ......... *G05B 13/048* (2013.01); *G05B 13/027* (2013.01); *G05B 13/041* (2013.01); *G06F 30/27* (2020.01)

(58) Field of Classification Search
CPC .. G05B 13/027; G05B 13/041; G05B 13/048; G06F 30/27
See application file for complete search history.

(56) References Cited

U.S. PATENT DOCUMENTS

| | | | |
|---|---|---|---|
| 9,547,821 B1* | 1/2017 | Loreggia | G06N 3/08 |
| 2015/0199606 A1* | 7/2015 | Raghunathan | G06N 5/04 706/53 |
| 2017/0031332 A1* | 2/2017 | Santin | G06F 17/16 |
| 2017/0243124 A1* | 8/2017 | Wang | G06N 20/00 |
| 2020/0293009 A1* | 9/2020 | Quirynen | G05B 13/041 |

* cited by examiner

*Primary Examiner* — Tameem D Siddiquee
(74) *Attorney, Agent, or Firm* — Gene Vinokur

(57) ABSTRACT

A method for controlling a system by a controller comprises accepting a current state of the system and selecting, using a trained function of the current state, a solver from a set of solvers. The method further comprises solving an optimal control optimization problem using the selected solver to produce a current control input, such that for at least some different control steps, the predictive controller solves a formulation of the optimal control optimization problem with different solvers having different accuracies, requiring different computational resources, or both and submitting the current control input to the system thereby changing the current state of the system.

18 Claims, 17 Drawing Sheets

$$\min_{X,U} \sum_{k=0}^{N-1} \frac{1}{2} \begin{bmatrix} x_k \\ u_k \end{bmatrix}^\top H_k \begin{bmatrix} x_k \\ u_k \end{bmatrix} + \begin{bmatrix} q_k \\ r_k \end{bmatrix}^\top \begin{bmatrix} x_k \\ u_k \end{bmatrix} \quad (2a)$$

$$\text{s.t.} \quad x_0 = \hat{x}_0, \quad \hat{x}_0 \in \mathbb{X}, \quad (2b)$$

$$x_{k+1} = [A_k \; B_k] \begin{bmatrix} x_k \\ u_k \end{bmatrix} + a_k, \quad k \in \mathbb{Z}_0^{N-1}, \quad (2c)$$

$$\underline{y}_k \le [C_k \; D_k] \begin{bmatrix} x_k \\ u_k \end{bmatrix} \le \bar{y}_k, \quad k \in \mathbb{Z}_0^N, \quad (2d)$$

$$u_{k,j} \in \mathbb{Z}, \quad j \in \mathcal{I}_k, \quad k \in \mathbb{Z}_0^M, \quad (2e)$$

FIG. 4

| B&B Method for the MIQP-OCP |
|---|

Input: Upper bound UB, tolerance $\epsilon$.
1: $LB = -\infty$ and initialize $L = \{P_0\}$ with root node. ~ 510
2: Select current node $P_c \leftarrow P_0$.
3: while $UB - LB > \epsilon$ do ~ 511
4:    Apply domain propagation to $P_c$ using Alg. 2. ~ 520
5:    Solve resulting QP relaxation with PRESAS. ~ 521
6:    if QP is feasible and $J(\bar{X}, \bar{U}) \leq UB$ then ~ 525
7:       if QP solution is not integer-feasible then ~ 535
8:          $LB \leftarrow \min_{P \in L} J(P)$.
9:          Select branching variable $v$ using Alg. 1. ~ 545
10:         Create subproblems $P_u$ "up" and $P_l$ "down". ~ 550
11:         Append $\{P_l, P_u\}$ to $L$ if $(1-\bar{v})\phi_v^+ < \bar{v}\phi_v^-$, or append $\{P_u, P_l\}$ to $L$, otherwise.
12:      else
13:         $UB \leftarrow J(\bar{X}, \bar{U})$ and $(X^*, U^*) \leftarrow (\bar{X}, \bar{U})$. ~ 530
14:      end if
15:   end if
16:   Remove current node $P_c$ from to-do list in $L$. ~ 540
17:   Select next node based on depth-first (last node in list $L$) or based on best lower bound. ~ 515
18: end while

Output: MIQP solution vector $(X^*, U^*)$. ~ 355

FIG. 5

| MI-MPC with Disagreement Learning |
|---|
| Require: Initial condition, $x_0$ |
| Require: Trained disagreement network, DISNET |
| Require: Exact (strong) solver, $u^S$ |
| Require: Approximate (weak) solver, $u^W$ |
| 1: for $t = 0 : \infty$ do |
| 2:     $\ell_t \leftarrow$ DISNET$(x_t)$     ▷ evaluate DNN (fast) |
| 3:     if $\ell_t$ is agreement then |
| 4:        $U_t \leftarrow u^W(x_t)$     ▷ use weak solver (fast) |
| 5:     else if $\ell_t$ is disagreement then |
| 6:        $U_t \leftarrow u^S(x_t)$     ▷ use exact solver |
| 7:     else |
| 8:        if $u^S(x_t)$ has feasible solution (fast) then |
| 9:           $U_t \leftarrow u^S(x_t)$     ▷ use exact solver |
| 10:        else |
| 11:           $U_t \leftarrow *$     ▷ handle infeasibility |
| 12:        end if |
| 13:     end if |
| 14:     $u_t \leftarrow U_t[:,0]$     ▷ apply first control action |
| 15:     $x_{t+1} \leftarrow f(x_t, u_t)$     ▷ collect updated state |
| 16: end for |

FIG. 6

APPARATUSES SYSTEMS AND METHODS FOR OPTIMIZATION-BASED CONTROL OF PHYSICAL SYSTEMS

TECHNICAL FIELD

The invention relates generally to model predictive control, and more particularly to systems and methods for optimization-based control of physical systems based on disagreement learning.

BACKGROUND

Optimization based control and estimation techniques, such as model predictive control (MPC), allow a model-based design framework in which the system dynamics and constraints can directly be taken into account. MPC is used in many applications to control dynamical systems of various complexities. Non-limiting examples of such systems include production lines, car engines, robots, numerically controlled machining, satellites and power generators.

The MPC is based on a real time finite horizon optimization of a model of a system. The MPC has the ability to anticipate future events, and to take appropriate control actions. This is achieved by optimizing the operation of the system over a future finite time-horizon subject to constraints, and only implementing the control over a current time step.

The MPC can predict the change in state variables of the modeled system caused by changes in control variables. The state variables define a state of the system, i.e., a state of a controlled system is the smallest set of state variables in state-space representation of the control system that can represent the entire state of the system at any given time. For example, if a controlled system is an autonomous vehicle, the state variables may include position, velocity and heading of the vehicle. Control variables are inputs to the system designed to change a state of the machine. For example, in a chemical process, the control variables are often pressure, flow, temperature, opening of the valves, and stiffness of dampers. State variables in these processes are other measurements that represent either control objectives or process constraints.

The MPC uses models of the system, the current system measurements, the current dynamic state of the process, and state and control constraints to calculate future changes in the state variables. These changes are calculated to hold the state variables close to target subject to constraints on both control and state variables. The MPC typically sends out only the first change in each control variable to be implemented and repeats the calculation when the next change is required.

The MPC framework can be further extended to hybrid systems with continuous and discrete elements of operations that involve both continuous and discrete variables in the model, objective and/or constraints that describe the dynamics of the system, performance metric and/or objective of control. Such an extension can provide a powerful technique to model a large range of problems, e.g., including dynamical systems with mode switching or quantized control, problems with logic rules or no-go zone constraints. However, the resulting optimization problems for such systems are highly non-convex, and therefore difficult to solve in practice. MPC is designed to operate in continuous space, while discrete variables can assume only a specific set of typically integer values. When using a quadratic objective in combination with linear system dynamics and linear inequality constraints, the resulting optimal control problem (OCP) can be formulated as a mixed-integer quadratic program (MIQP) that needs to be solved in order to implement a mixed-integer model predictive control (MI-MPC) method.

The MPC numerical methods are implemented on various computational apparatus often designed specifically for a given system. Computational apparatus can range from inexpensive fixed-point precision embedded controllers to sophisticated multi-core central processing units (CPU), graphics processing unit (GPU), field-programmable gate array (FPGA), or dedicated parallel computer clusters. However, the MPC extension to hybrid systems is extra computationally demanding. In addition to performing a moving horizon optimization, a hybrid MPC controller aims to solve such a mixed-integer (MI) program at every sampling time instant. This is a difficult combinatorial task, because mixed-integer programming is NP-hard in general.

In a number of practical applications, there is a need to implement MI-MPC on an embedded control system with limited computational capabilities. An embedded control system is a programmed controlling and operating system with a dedicated function within a larger mechanical or electrical system, often with real-time computing constraints. It is embedded as part of a complete device often including hardware and mechanical parts. Examples of properties of typical embedded control systems when compared with general-purpose counterparts are low power consumption, small size, rugged operating ranges, and low per-unit cost. This comes at the price of limited processing resources, which make embedded systems more difficult to program and to interact with.

Due to complexity of MI-MPC controllers, it is challenging to implement such a controller on an embedded control system arranged for real-time control. For example, currently, it is impractical to implement MI-MPC for complex and hybrid dynamical systems, such as an autonomous vehicle or sophisticated simulation models of buildings and HVAC systems that capture complex multi-physical interactions, on certified embedded control hardware that is typically used by current advanced driver-assistance systems (ADAS).

Accordingly, there is a need for efficiently computing solutions to mixed-integer optimization-based control problems, such as in model predictive control (MPC) of hybrid systems. For such systems, there is a strong need for tailored optimization and solver implementation for embedded MI-MPC applications running on microprocessors with restricted computational resources and available memory.

SUMMARY

Some example embodiments pertain to model predictive control (MPC) that allows handling of performance optimization and constraints by solving a constrained optimal control problem at each time step. Such a framework is extendible to hybrid dynamical systems that include both continuous and discrete decision variables, providing a powerful model-based control design for a large class of problems, for example: switched dynamical systems, discrete or quantized actuation, logic rules and temporal logic specifications.

For a linear-quadratic objective, (piecewise) linear dynamics and linear constraints, the optimization problem can be formulated as a mixed-integer quadratic program (MIQP). Some example embodiments are based on a realization that Mixed-integer MPC (MI-MPC) for hybrid dynamical systems needs to solve this MIQP at every sampling time instant. Some example embodiments utilize fast heuristic approaches to find feasible but typically suboptimal solutions. Non-limiting examples of such fast heuristic approaches include rounding schemes, the feasibility pump, approximate optimization algorithms, or the use of machine learning.

Some embodiments are based on recognition that the solution of the MI-MPC includes two stages. The first stage is a search stage that includes searching for different values of discrete variables that may belong and/or may lead to the solution. For example, the objective of the search stage is to find a continuous portion of a relaxed search space that may include the discrete optimal solution. The second stage is an optimization stage that involves solving an MPC problem within the continuous portion of the relaxed search space identified during the search stage. The search stage is usually an iterative process that tries different combinations of values for discrete variables to find multiple portions of the relaxed continuous search space. The optimization stage is performed for each portion of the relaxed continuous search space and/or combination of discrete variables selected by the search stage. Hence, the solution of the MI-MPC problem usually involves multiple solutions of MPC problems. Because the MI-MPC problem needs to be solved for each control step, solving a potentially large number of MPC problems for each control step is computationally challenging especially for microprocessors of embedded systems.

Some example embodiments are based on the realization that different quality of solvers can be used at different time steps, based on which region of the state space the dynamical system resides in. For instance, some example embodiments utilize a simple and cheap solver away from the constraints, and a more powerful solver near the constraints. Such a switching of solvers results in reduction of practical complexity, for example, the amount of computation resources required in practice, as opposed to theoretical worst-case scenarios, in optimization-based control.

Towards this end, some example embodiments provide a framework where a fast heuristic technique is used when possible, while relying on an exact optimization algorithm when necessary. In some example embodiments, the exact optimization solver may be referred to as a strong, usually expensive, solver while the heuristics-based solver may be referred to as a weak, typically cheap, solver. The strong solver solves the mixed-integer optimal control optimization problem using a branch-and-bound (B&B) optimization that searches for a global optimal solution within a search. The weak solver solves a relaxation of the B&B optimization. Consequently, the amount of the computational resource used by the strong solver to solve the mixed-integer optimal control optimization problem is greater than the amount of the computational resource used by the weak solver to solve the mixed-integer optimal control optimization problem.

Some example embodiments are based on identification of disagreement regions in the search space. The disagreement regions may be considered as sub-regions in the search space where the weak and strong solvers disagree, according to some pre-defined logic or metric. Some example embodiments realize that the dependency on the expensive solver may be reduced by identifying the disagreement regions. If such a disagreement region is identified, then this is where the strong solver is required; and for the rest of the feasible region, the weak solver replaces the strong solver, since the two solvers are in agreement in the feasible region of the search space.

However, understanding which solver to use in which region of the state-space is very difficult to do analytically. Therefore, some example embodiments are based on the realization that computing such disagreement region(s) analytically is difficult as the geometries of such regions are rarely well-behaved. It is therefore an objective of some example embodiments to learn these regions automatically. Towards this end, some example embodiments utilize supervised learning approaches that have performed well in identifying complex sets in control applications such as reachable and invariant sets or even control policies for nonlinear systems, without requiring complete knowledge of the underlying dynamical system.

Some example embodiments provide the use of efficient supervised learning algorithms that are capable of inducing functions whose level sets can approximate the complex geometries of disagreement regions. Some example embodiments select a solver from a set of solvers by using a function trained on a current state of a subject system. The trained function is trained with training data comprising samples of a search space for the outputs of the system labeled with a disagreement criterion between solutions of the optimization problem produced by the strong solver and the weak solver for the system at the states indicated by the sampled outputs.

When the true disagreement region is not large the practical complexity can potentially be reduced from the complexity of the strong solver to the complexity of the weak solver, with the added inferential complexity of the learner which has to identify which solver has to be queried. As such, deep neural networks are the suitable choice, since they are cheap to evaluate at inference time, and they are capable of learning complex sub-region boundaries. Thus, example embodiments lead to a major advantage, since the weak and strong solvers could be implemented in a high-fidelity simulation environment where the internal mathematical representations cannot be accessed.

The disagreement criterion between solutions of the optimization problem produced by the strong solver and the weak solver for the system is determined based on one or a combination of several factors such as feasibilities of the solutions produced by the strong solver and the weak solver, a distance between the solutions produced by the strong solver and the weak solver, a degree of suboptimality between the strong solver and the weak solver, and a time required to obtain a solution by the strong versus the strong solver Some example embodiments pertain to a control process of a system where the control process comprises a plurality of control steps. Some example embodiments provide that for at least some different control steps of the control process, a formulation of the optimal control optimization problem (or simply optimal control problem) may be solved with one or more of different solvers having different accuracies or using different amounts of computational resources. Such a solution provides a set of control inputs for each control step. These control inputs are provided to the system to change the state of the system, thereby exhibiting control of the system.

Accordingly, one embodiment discloses a controller for controlling a system. The controller includes memory having instructions stored thereon and a processor execute the instructions to cause the controller, for each of control steps, to accept a feedback signal including a current output of the system indicative of a current state of the system. The processor further causes the controller to select, using a trained function of the current output, a solver from a set of solvers, wherein each solver in the set of solvers is configured to solve an optimization problem by spending computational resources of the processor to produce a solution with an accuracy associated with the solver. The processor further causes the controller to solve an optimal control optimization problem using the selected solver to produce a current control input, such that for at least some different control steps, the predictive controller solves a formulation of the optimal control optimization problem with different solvers having different accuracies, requiring different computational resources, or both. The current control input is then submitted to the system thereby changing the current state of the system.

Another embodiment discloses a method for controlling a system. The method comprises accepting, by a predictive controller, a feedback signal including a current output of the system indicative of a current state of the system. The method further comprises selecting, using a trained function of the current output, a solver from a set of solvers, wherein each solver in the set of solvers is configured to solve an optimization problem by spending computational resources of the processor to produce a solution with an accuracy associated with the solver. The method further comprises solving an optimal control optimization problem using the selected solver to produce a current control input, such that for at least some different control steps, the predictive controller solves a formulation of the optimal control optimization problem with different solvers having different accuracies, requiring different computational resources, or both and submitting the current control input to the system thereby changing the current state of the system.

Yet another embodiment discloses a non-transitory computer readable storage medium embodied thereon a program executable by a processor for performing a method for controlling a system. The method includes accepting, by a predictive controller, a feedback signal including a current output of the system indicative of a current state of the system. The method further comprises selecting, using a trained function of the current output, a solver from a set of solvers, wherein each solver in the set of solvers is configured to solve an optimization problem by spending computational resources of the processor to produce a solution with an accuracy associated with the solver. The method further comprises solving an optimal control optimization problem using the selected solver to produce a current control input, such that for at least some different control steps, the predictive controller solves a formulation of the optimal control optimization problem with different solvers having different accuracies, requiring different computational resources, or both and submitting the current control input to the system thereby changing the current state of the system.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments

FIG. 4 illustrates an example relaxed mixed-integer model predictive control (MI-MPC) problem solved by a solver according to some embodiments;

FIG. 5 illustrates pseudo code of a branch-and-bound mixed-integer optimization algorithm to search for the integer-feasible optimal control solution based on a nested tree of search regions and corresponding lower/upper bound values;

FIG. 6 illustrates pseudo code of a solver selection algorithm, according to some embodiments;

DETAILED DESCRIPTION

Figure 1A:
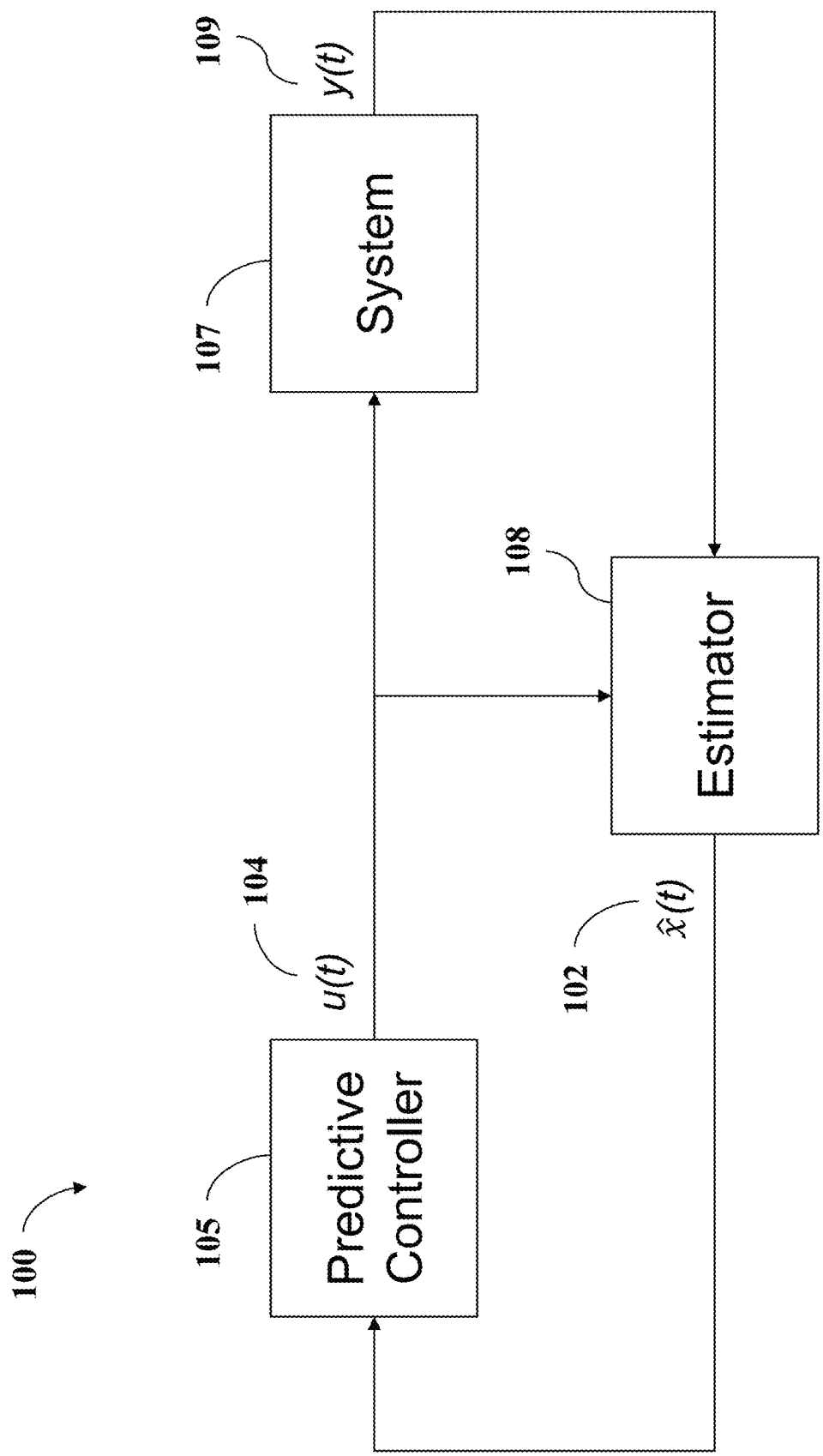
FIG. 1A is a block diagram of a predictive controller based feedback system according to some embodiments.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicate like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Some embodiments of the invention provide a system and a method for controlling an operation of a system or a system using a predictive controller. An example of the predictive controller is a model predictive control (MPC) determining control inputs based on a model of the controlled system.

A controller is a device, or set of devices, that manages, commands, directs or regulates the behavior of other devices or systems. Typically, a controller stores data indicative of the operation of the controlled system and uses such data for the controlling.

Many advanced control techniques are formulated as optimization problems, which can be solved by programming. For example, one class of such techniques is optimization-based receding time horizon control, such as model predictive control (MPC). There are MPC formulations for both linear and non-linear systems. Non-linear MPC solves non-linear programs in real-time, which can be a challenging task due to limited computing resources, the complexity of the problem to solve, or the time available to solve the problem. Therefore, most of the practical applications are based on a linearity assumption or approximation. The linear MPC typically solves a quadratic programming problem, i.e., the problem of optimizing (minimizing or maximizing) a quadratic function of several variables subject to linear constraints on these variables.

When compared to other control strategies, the MPC has the advantage of explicitly accounting for constraints and the ability to handle multiple inputs and outputs. However, the MPC is computationally complex because it requires an optimization problem to be solved at each time step in order to calculate the control output of the controller to be used as a control input of the system.

A dynamical system, that is a subject of control, may reside in different regions of a state space at different time instances. Thus, an optimization control problem for such a system varies in terms of complexity with time. In other words, different amounts of computational resources may be required at different instances of time to obtain a suitable control input for the system. As such, a single solver may not be the optimum computational choice in such scenarios as it may turn out to be computationally insufficient for some instances of the optimization control problem while in some scenarios it may turn out to be underutilized.

Some embodiments of the invention are based on the realization that different quality of solvers can be used at different time steps, based on which region of the state space the dynamical system resides in. For instance, a simple and cheap solver may be used away from the constraints, and a more powerful solver may be used near the constraints. Such a switching of solvers results in reduction of practical complexity (amount of computations required in practice, as opposed to theoretical worst-case scenarios) in optimization-based control.

However, selection of the solvers in the aforementioned manner is analytically complex. Particularly, to meet the demands of speed and agility for several industrial applications, the solver selection should be done seamlessly without incurring any significant delay. Some example embodiments of the present invention perform solver selection based on an identification of the region of state search space. Some example embodiments provide techniques for automatically learning different types of regions of the state search space for further aid in selecting a suitable solver for determining the required control input for the dynamical system.

FIG. 1A shows a block diagram of the control system 100 according to embodiments employing a model predictive control (MPC) for controlling the system 107. MPC is a control algorithm that reads the state or state estimate of a dynamical system and solves a finite horizon optimal control problem formulated over a future horizon from the system dynamics, system constraints, and objective cost function. Of the optimal sequence of control inputs 104 to the system 107 over the future horizon, the first component is applied to the system 107, and a new optimal control problem is solved in the predictive controller 105 over a shifted future horizon when the next state is read.

The control system 100 includes a model predictive controller 105, representing a controller using MPC, and a state estimator 108 to control the system 107. In some implementations, the predictive controller is an MPC controller programmed according to a dynamical model of the system. The model can be a set of equations representing changes of the state and output of the system 107 over time as functions of current and previous inputs and previous outputs. The model can include constraints that represent physical and operational limitations of the system.

During the operation, the controller 105 may receive a reference signal r(t) indicating the reference operation of the system as a function of time t. The reference signal can be, for example, a motion or a position command, or represent the desired value of some parameter in the system. In response to receiving the reference signal r(t), the controller 105 generates a control signal u(t) 104 for the system 107. In response to the input 104, the system 107 updates the output y(t) 106, and the estimator 108 estimates the state $\hat{x}(t)$ 102 of the system 107.

The system 107 can be any device that is controlled by manipulating control input signals 104, possibly associated with physical quantities such as voltages, pressures, forces, and returns system output 109 possibly associated with physical quantities such as currents, flows, velocities, and positions. The values of the output signal 109 are related in part to previous system output values, and in part to previous and current input values 104. The dependency of previous inputs and previous outputs can be encoded in the state 102. The operation of the system 107, e.g., a motion of the system, can include a sequence of output values generated by the system following the application of certain input values. The system 107 may include actuators, for modifying a system behavior according to the control signal 104, and sensors, which measure the system behavior producing an output signal y(t) 109. The system can be subject to physical limitations and specification constraints limiting the range where the outputs, the inputs, and also possibly the states of the system are allowed to operate.

The estimator 108 uses the system output y(t) 109 along with the current and past values of the control signal u(t) 104 to estimate the current state 102 of the system 170. The estimator 130 may be implemented in hardware or as a software program executed in a processor, either the same or a different processor from the controller 105, which at fixed or variable control period sampling intervals receives the outputs of the system 107 and determines, using the new and the previous output measurements, the estimated state of the system 107.

Figure 1B:
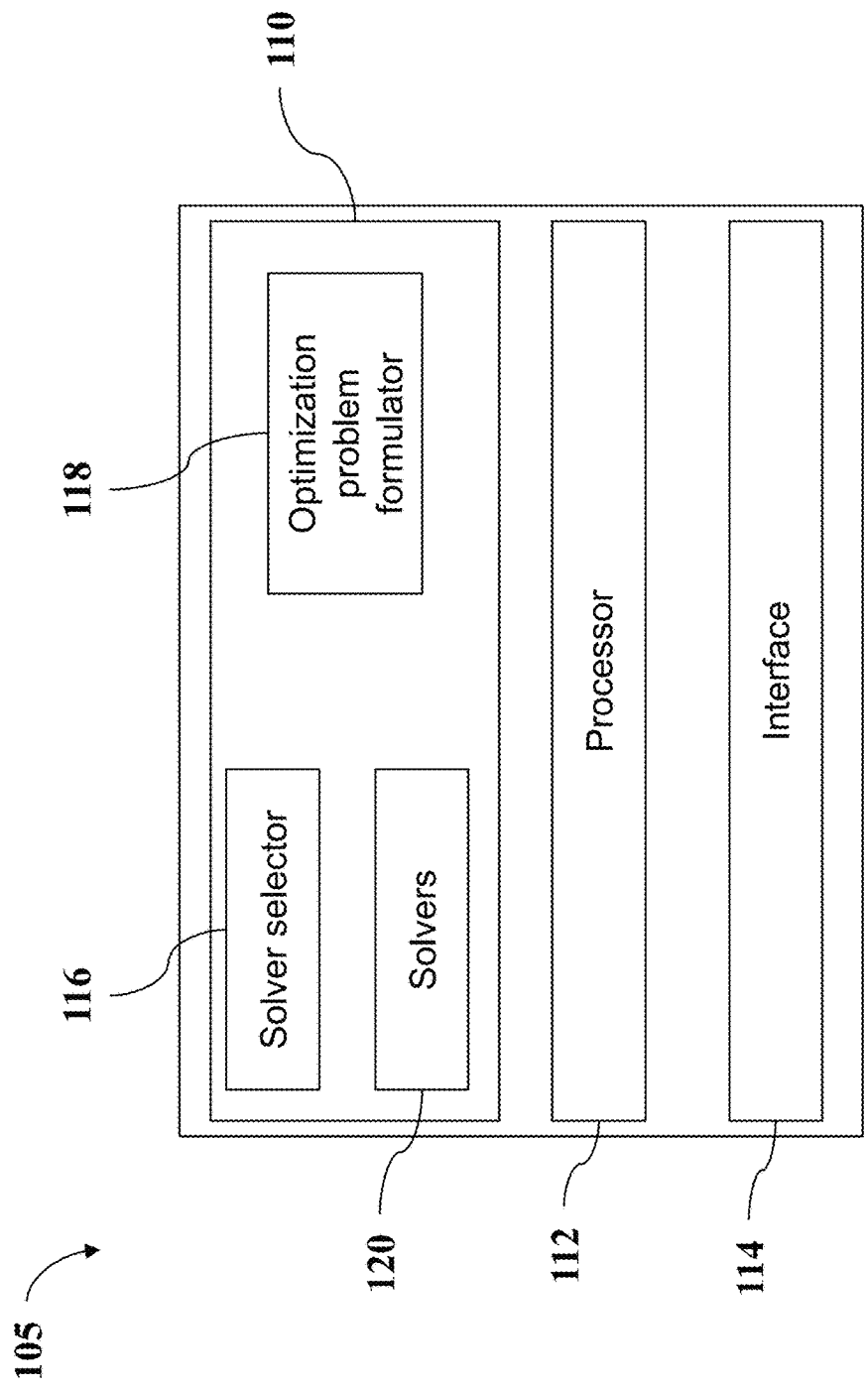
FIG. 1B is a block diagram of a predictive controller according to some embodiments.

The controller 110 may be implemented in hardware or as a software program executed in a processor 112 of FIG. 1B, e.g., a microprocessor, which at fixed or variable sampling intervals receives the system outputs and the reference operation of the system, and determines, using this information, the control inputs 104 for operating the system. The processor 112 is suitably programmed to perform the steps of the methods according to various embodiments, using the software modules stored in the memory 110 of FIG. 1B.

Referring to FIG. 1A, the reference signal r(t) may be combined with the estimated system state $\hat{x}(t)$ 102 of the system to form a (augmented) state vector θ. The state vector θ contains the system state 102 and possibly other quantities, for example, one or a combination of a reference signal r and values of the previous control signals, such as $u^{(-1)}$, $u^{(-2)}$, . . . . The model predictive controller 105 determines the control signal u(t) 104, based on the value of the state vector θ.

In some systems, the system state 102 is completely determined by the system 107 outputs y(t) 109, in which case the estimator 108 can form the state estimate directly as $\hat{x}(t)=My(t)$, where M is an appropriate square matrix of full rank. For example, if $\hat{x}(t)=y(t)$, the estimator 108 may not be needed. However, there are situations when some or all of the system state variables are unobservable by sensors, in which case the state estimate can be formulated in a number of different ways. For example, for a linear system:

$x(t+1)=Ax(t)+Bu(t)$ $y(t)=Cx(t)+Du(t)$, where A, B, C, D are matrices of appropriate size, an estimator 108 can be made according to the following formulas $z(t+1)=Az(t)+Bu(t)-L(y(t)-Cz(t)-Du(t))$ $\hat{x}(t)=C_z z(t)+C_u u(t)+C_y y(t)$, where L, $C_z$, $C_u$, $C_y$ are appropriately constructed matrices.

FIG. 1B is a block diagram of a predictive controller 105 according to some embodiments. The predictive controller 105 comprises a memory 110, a processor 112, and an interface 114. The memory 110 may store data required for execution of one or more functionalities of the predictive controller 105. In some example embodiments, the memory may store a program for executing a control process for the system 107. The program may comprise a plurality of software modules, for example a solver selector 116, an optimization problem formulator 118, and one or more solvers 120.

The processor 112 may be configured to execute the modules and/or any instruction stored on the memory 110 to carry out one or more functionalities of the predictive controller 105. Towards this end, the processor 112 may read out the memory in a manner designated by a program stored thereon. The processor 112 may further be in communication with an interface 114. The interface 114 may comprise one or more of a graphical user interface, a communication interface, any input interface, or any output interface. For example, the interface 114 may be utilized by the processor 112 to carry out input/output functions relevant to the predictive controller 105. In some example embodiments, the interface 114 may include a transceiver configured to submit a sequence of control inputs to the system and receive a feedback signal including a corresponding sequence of outputs of the system indicative of the state of the system caused by the corresponding control input.

Figure 1C:
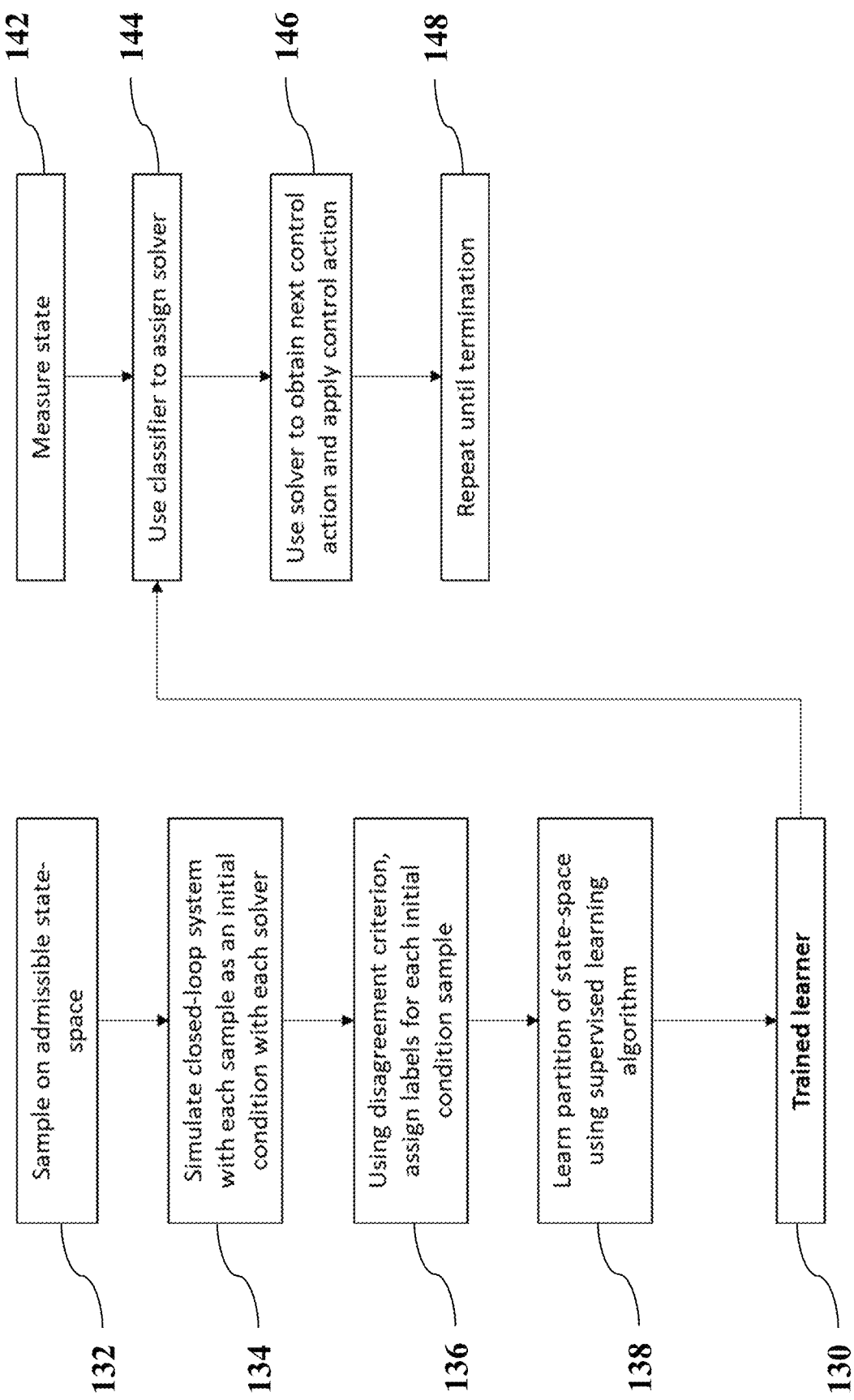
FIG. 1C is a flowchart describing a workflow for a control process according to some embodiments.

The predictive controller 105 may execute a series of steps to perform one or more control steps for the system 107. As discussed previously, towards this end, the predictive controller 105 may solve an MI-MPC problem at every control cycle in a computationally efficient manner to meet the requirements of speed, power, and agility in miniaturized and high-end implementations such as in embedded applications. The predictive controller 105 may perform a series of steps offline in order to learn the different types of regions of search space. A trained function (also referred to as a trained learner or learner) may be obtained as an outcome of the execution of the offline steps. Such a trained function is able to predict a class or type of state search space region during a real time or online stage of the control process. FIG. 1C illustrates such a flowchart describing a workflow of offline and online steps for a control process according to some embodiments. Steps 132-138 to obtain the trained learner 130 constitute the offline stage while steps 142-148 constitute the online stage of the control process. It is to be noted that one or more intermediate steps may also be possible within the offline and/or online stage. These steps are executed by a control system such as control system 100 illustrated in FIG. 1A.

In the first step of the offline stage, a sample on admissible state space 132 may be obtained. Admissible state space may be defined based on one or more criterion specifying the data defining the system output 109. For example, as mentioned previously, the system output 109 may possibly include data associated with physical quantities such as currents, flows, velocities, and positions. Admissible state space may be defined in relation to a threshold associated with each such physical quantity.

The closed loop dynamical system 107 may be simulated 134 with each of the samples on admissible state space as an initial condition with each solver. For example, there may be two solvers—one utilizing less computational resources (referred as weak solver) and one utilizing relatively greater computational resources (referred as strong solver). Each of the samples may be provided as in initial condition for solving the underlying optimization control problem (for example an MI-MPC) by each of the solvers.

Since the corresponding optimization control problem for different regions or samples of the state search space may be of a different level of complexity, a disagreement may occur in the solutions of the two solvers for the same sample. That is, a disagreement between solutions of the optimization problem produced by the strong solver and the weak solver for the system at the states indicated by the sample may be possible. This may arise, for example, due to the weak solver not being able to solve the OCP or returning an infeasible response as the solution to the OCP. There may be several factors defining the disagreement criterion between the solvers. Each such sample where disagreement criterion is satisfied may be accordingly labeled. That is, labels may be assigned 136 to each of the samples inputted as an input condition to the solvers.

For training the disagreement network, labels are computed for state samples extracted from the admissible state-space. For example, $N_s$ samples $\{\hat{x}_0^i\}_{i=0}^{N_s} \in X$ may be extracted. With each sample used as an initial condition, the closed-loop system is simulated 134 forward for a simulation horizon of T time steps, and the problem (1a) is iteratively solved with the strong solver at each time step to obtain $\xi^S(\hat{x}_0^i, T)$. If the closed-loop trajectory obtained is infeasible, then the sample $\hat{x}_0^i$ is labeled as infeasible. If the sample is feasible, a second forward simulation is run from the same initial condition $\hat{x}_0^i$ with the weak solver, which yields $\xi^W(\hat{x}_0^i, T)$. If both trajectories are feasible, $\hat{x}_0^i$ is labeled as agreement, otherwise as disagreement.

To summarize, the label for the sample $\hat{x}_0^i$ is given by $$\ell(\hat{x}_0^i) = \begin{cases} \text{agreement} & \text{if } \hat{x}_0^i \in X_A(T) \\ \text{disagreement} & \text{if } \hat{x}_0^i \in X_D(T) \\ \text{infeasible} & \text{otherwise} \end{cases} \quad (A)$$

The samples $\{\hat{x}_0^i\}_{i=0}^{N_s}$ can be sampled uniformly over the admissible state-space X, or with low-discrepancy sampling or active sampling to reduce sample complexity. Since labeling is done offline, there is no strict restriction on real-time feasibility or computational expenditure.

Once labeling is complete, a classifier or function 130 is constructed that classifies any $\hat{x}_0 \in X$ into one of the three categories described in (A) above. Towards this end any of several techniques popularized by the machine learning community may be utilized. For example to solve multi-class problems, deep neural networks (DNN) may be deployed owing to their flexibility in inducing complex decision boundaries and their ability to handle a large number of samples. This quality is essential to implement this method for systems with high-dimensional state-spaces. This disagreement learning network may be referred to as DisNet.

In some example embodiments, it may be impractical to assume that DisNet can provide perfect accuracy when trained with finite samples, misclassifications in directions that are preferable from a safety viewpoint may be promoted. In particular, a cost-sensitive categorical cross entropy function may be used as the training loss. Concretely, classifying a sample in the disagreement region incorrectly with the agreement label is penalized more heavily than a sample in the agreement region classified as disagreement. This is because an initial condition that is truly within $X_A(T)$ misclassified to be within $X_D(T)$ will result in the strong solver being used to compute trajectories, which will incur computational expenditure, but result in desired closed-loop behaviour.

Conversely, if an initial condition is truly within the disagreement region but DisNet assigns it to the agreement region, the weak solver will not induce feasible closed-loop trajectories and will result in constraint violations. Similarly, classifying infeasible samples as disagreement is more harmful than classifying samples within the disagreement region as infeasible. This is because if an initial condition truly is infeasible, using the strong solver (because it is misclassified to be within $X_D(T)$) will not result in useful trajectories, whereas labeling a disagreement region sample as infeasible will trigger a fail-safe mechanism that is typically in place for most practical engineering systems. Any misclassification can result in loss of optimality of operation, but DisNet errs on the side of caution and promotes safety via asymmetry in the training loss.

A supervised learning-based approach may be applied to learn the partitioning of the state search space 138. The supervised learning-based approaches perform well in identifying complex sets in control applications such as reachable and invariant sets or even control policies for nonlinear systems, without requiring complete knowledge of the underlying dynamical system. This is a major advantage, since the weak and strong solvers could be implemented in a high-fidelity simulation environment where one cannot access the internal mathematical representations. Towards this end, efficient supervised learning algorithms such as that are capable of inducing functions whose level sets can approximate the complex geometries of disagreement regions may be utilized. The choice of deep neural networks (DNN) is suitable, since they are cheap to evaluate at inference time, and they are capable of learning complex sub-region boundaries. Using such supervised learning-based approaches, the trained learner or the trained function 130 for identifying a suitable solver based on the region of state search space may be obtained. Having the trained learner ready prior to the real time or online stage helps in a seamless execution of the control process.

The online stage comprises measuring 142 the system output of the system 107 at run time. The output includes amongst other things data indicative of a current state of the system. Towards this end, the estimator may be utilized. The predictive controller 105 may thus accept a feedback signal including the current output of the system. The current output is indicative of the current state of the system 107.

The trained learner 130 may then be invoked to select 144 a solver from a set of solvers for solving the OCP associated with the control of the system 107. For example, the control output indicating the current state of the system 107 may be classified by the classifier function 130 into one of the three categories described in (14). If the state is classified as agreement, the weak solver may be selected to save on the computational resources. If the state is classified as disagreement, the strong solver may be selected to enforce a feasible solution is available for the optimization problem.

Having obtained the suitable solver, the OCP is solved to obtain 146 the next control action. For example, the selected solver may solve optimal control optimization problem to produce a current control input for the system 107. The produced control input may be submitted to the system 107 to apply the next control action. The next control action thus leads to a change of the current state of the system 107 and the online stage repeats 148 until a termination condition is attained. The termination condition may be an interrupt or a signal indicating no further action is required by the system.

Figure 2A:
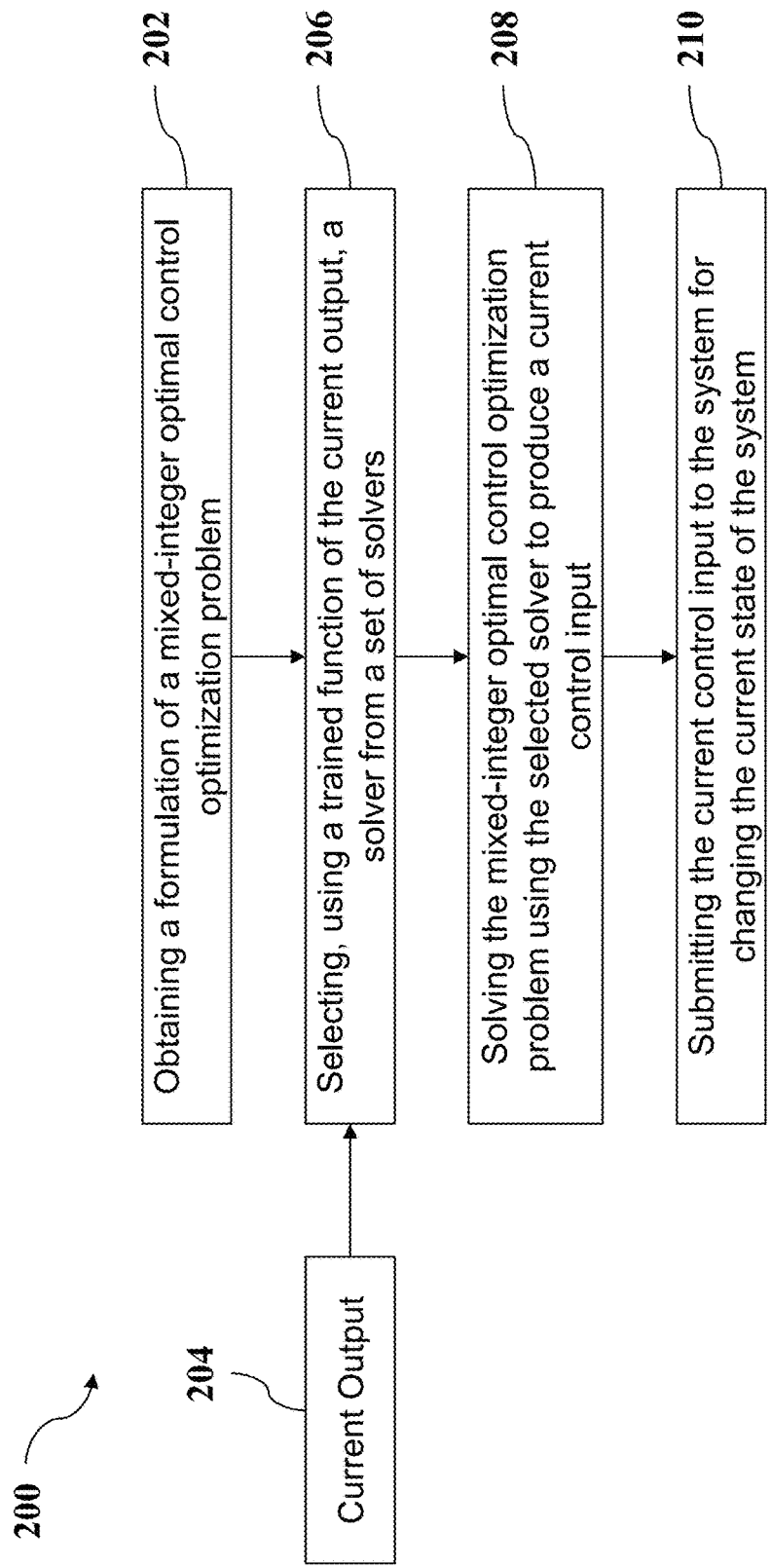
FIG. 2A is a flowchart illustrating a method for controlling a system according to some embodiments.

The aforementioned workflow is one example of a process for controlling a system using MPC. An MPC controller may execute some or all of the steps of the workflow. FIG. 2A illustrates a flowchart illustrating a method 200 for controlling a system according to some embodiments. The method 200 is implemented by a controller such as the predictive controller 105. The method corresponds to the runtime execution of the online stage of the control process of the system 107.

The controller may obtain a formulation 202 of the mixed-integer optimal control optimization problem. In some example embodiments, the controller, using the system model, may formulate the optimization problem on the fly. When using a quadratic objective in combination with linear system dynamics and linear inequality constraints, the resulting optimal control problem (OCP) can be formulated as a mixed-integer quadratic program (MIQP) that needs to be solved in order to implement a mixed-integer model predictive control (MI-MPC) method.

A class of dynamical systems may be represented by $$x_{t+1} = Ax_t + Bu_t + a, \quad (1)$$

$$y_t = Cx_t + Du_t, \quad (2)$$

where t is the time index, $x_t \in X \subset R^{n_x}$ is the state variable, $u_{t,j} \in Z$, $j \in I_t$ is an integer control action, $u_{t,j} \in R$, $j \notin I_t$ is a continuous control action, $I_t$ denotes a set of indices, $a \in R^{n_x}$ is an affine known term, and $y_t \in R^{n_y}$ is the output of the system. The matrices A, B, C, and D have appropriate dimensions. A finite-horizon MI-MPC problem may be solved from an initial condition $\hat{x}_0 \in X$ of the form $$\min_{X,U} \sum_{k=0}^{N1} \frac{1}{2} \begin{bmatrix} x_k \\ u_k \end{bmatrix}^T H \begin{bmatrix} x_k \\ u_k \end{bmatrix} + \begin{bmatrix} q \\ r \end{bmatrix}^T \begin{bmatrix} x_k \\ u_k \end{bmatrix} \quad (3)$$

$$+ \frac{1}{2} x_N^T P x_N + p^T x_N$$

subject to $x_0 = \hat{x}_0, \hat{x}_0 \in X,$ (4)

$$x_{k+1} = Ax_k + Bu_k + a, k \in Z_0^{N-1}, \quad (5)$$

$$\underline{y}_k \leq Cx_k + Du_k \leq \overline{y}_k, k \in Z_0^{N-1}, \quad (6)$$

$$u_{k,j} \in Z, j \in I_k, k \in Z_0^{N-1}, \quad (7)$$

$$\underline{y}_N \leq Ex_N \leq \overline{y}_N, \quad (8)$$

where the notation $Z_0^N$ denotes the range of integers 0, 1, . . . , N, and the optimization variables are the state $X = [x_0^T, \ldots, x_N^T]^T$ and control $U = [u_0^T, \ldots, u_{N-1}^T]^T$ sequences. For simplicity of notation, the set $I_k$ denotes the indices of the discrete control variables for each step $k \in Z_0^N$ of the prediction horizon. The Hessian matrices in (3) are assumed to be positive semi-definite, i.e., H≥0 and P≥0. The vector a is an affine term in the model, and the vectors q, r, p define the linear component of the cost. Note that the inequality constraints in (6) typically include simple bounds on some of the optimization variables; for instance, in order to define binary optimization variables. Also, the admissible state space X could be defined within (6).

The current output from the system may be accepted 204 by the predictive controller. Using the current output and the trained learner 130, the predictive controller selects 206 a solver from a set of solvers for solving the optimization problem.

In some example embodiments, the set of solvers includes one or more strong solvers and one or more weak solvers available for solving the optimization problem. A solver may correspond to an algorithm, a computer program or in some cases a hardware module. The accuracy of the solution produced by the strong solver over a larger number of iterations is greater than the accuracy of the solution produced by the weak solver over a smaller number of iterations. In some example embodiments, the strong solver solves the mixed-integer optimal control optimization problem using a branch-and-bound (B&B) optimization that searches for a global optimal solution within a search space to produce the current control input. In some example embodiments, the weak solver solves a relaxation of the B&B optimization, such that the computational resource required by the strong solver to solve the mixed-integer optimal control optimization problem is greater than the computational resource required by the weak solver to solve the mixed-integer optimal control optimization problem. One example of the B&B optimization is illustrated in FIG. 5 which will be described later in detail.

Some example embodiments use advanced, pre-solve, branching and cutting plane techniques to allow the strong solver to be computationally efficient for many practical MIQPs. However, the worst-case computational complexity scales exponentially with the number of integer optimization variables in (1e). Towards this end, different heuristic techniques can be used to compute solutions of the OCP that are (approximately) feasible and suboptimal, which could be used as a weak solver. For example, a part of the integer variables may be relaxed, that is, they are allowed to have real values. More specifically, the integer-valued constraints in (1e) may be replaced to generate the relaxed problem illustrated by 2a-2e in FIG. 4, where M≤N and practically M<<N such that the computational cost for solving the resulting relaxed MIQP is considerably lower than for solving (1a). Note that at least the first control input values $u_0$ satisfy the integer constraints when M≥1 in the weak solver. Due to state feedback, the use of the weak solver in closed-loop can result in acceptable performance.

The solver selection using the trained learner is described next. In some example embodiments, the learner may be realised through a deep neural network based classifier. Let the initial state during on-line operation be denoted $x_0$, and the state at the t-th time step be denoted $x_t$. At each time step t, the deep neural network (DNN) is queried to determine whether $x_t$ is infeasible or belongs to $X_D(T)$ or $X_A(T)$. Accordingly, the strong or weak solver is called to compute a sequence of control actions for the prediction horizon length N. Following the philosophy of MPC, in some example embodiments, only the first control action in the sequence obtained may be implemented. Thus, the control law has the form $$u^*(x_t) = \begin{cases} u_0^W(x_t) & \text{if } \ell(x_t) = \text{agreement}, \\ u_0^S(x_t) & \text{if } \ell(x_t) = \text{disagreement}, \\ u_0^S(x_t) & \text{if } \ell(x_t) = \text{infeasible}, \end{cases} \quad (B)$$

where $\ell(x_t)$ is the DNN classifier output obtained by evaluating DNN for the state $x_t$, and $u_0^W(u_0^S)$ is the first control action computed by the weak (respectively, strong) solver with the initial state $x_t$ and a prediction horizon of length N. Pseudocode for implementing the proposed MI-MPC with DNN in the loop is provided in FIG. 6.

In some example embodiments, the use of the strong solver when a state is classified as infeasible is a safety mechanism in case there is a misclassification, and the state is actually in the disagreement region. In such a case, the strong solver can compute a feasible solution. If the strong solver cannot compute a feasible solution (that is, the state is indeed in the infeasible region), then a safety mechanism specific to the application may be deployed to avoid catastrophic failure. Since it is typical for state-of-the-art mixed-integer programming solvers to attain feasibility information far more quickly compared to the optimal solution, such a safety mechanism is practical as the system will not remain in an unsafe mode of operation for very long, when the state is infeasible.

In some example embodiments, the purpose of considering two different solvers and a classifier to solve the optimal control problem, is to hasten the computational performance while maintaining a feasible trajectory. Indeed, even if the classifier requires additional computational time online, a learner is designed such that the time for obtaining a classification plus the time to find an optimal solution with the weak solver is still lower than the time required by standard methods that consider only a strong solver. The smaller the volume of the disagreement region (which is problem-dependent), the more the potential speedup of on-line computations.

Referring to FIG. 2A, the predictive controller solves 208 the mixed-integer optimal control optimization problem using the selected solver to produce a current control input. The predictive controller submits 210 the current control input to the system for changing the current state of the system. The steps 202-210 correspond to one iteration of the online stage.

Figure 2B:
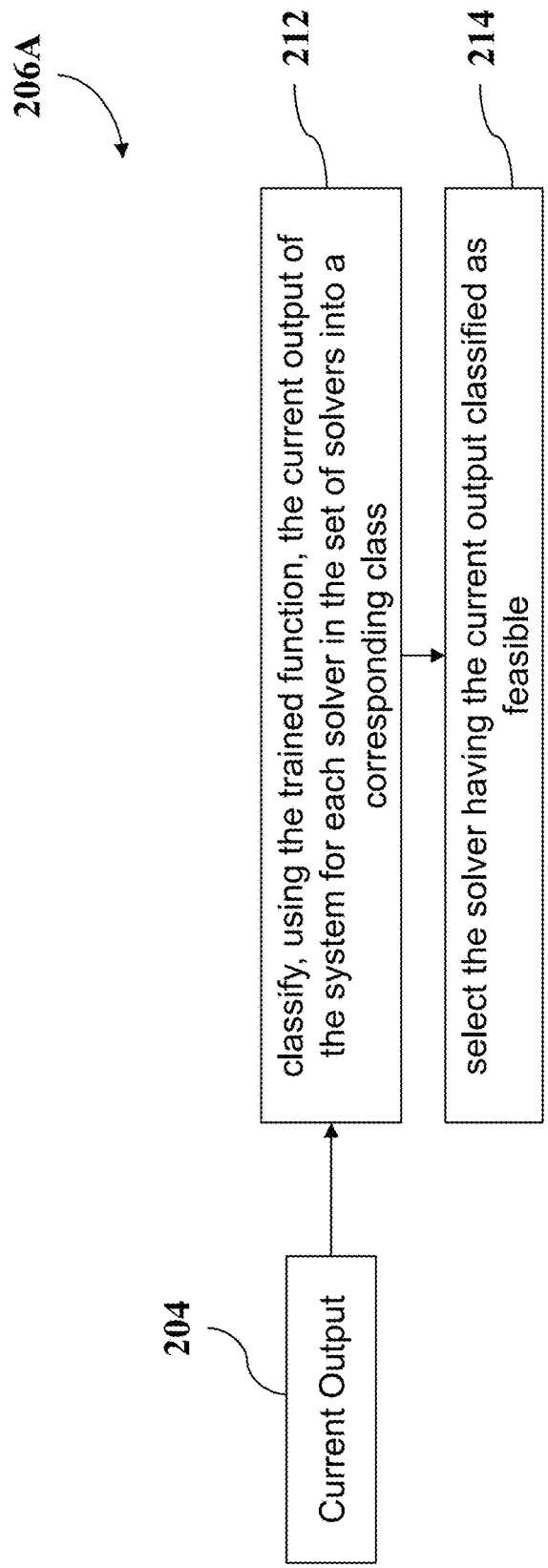
FIG. 2B is a flowchart illustrating a method for selecting a solver from a set of solvers according to some embodiments.

FIG. 2B illustrates one example method 206A for selecting a solver according to some example embodiments. The current output 204 of the system is classified 212 using the classifier/trained function, for each solver in the set of solvers (for example, for both of the weak and strong solvers) into a feasible or infeasible class as discussed above. One of the solvers (that is the weak solver) in the set of solvers produces a feasible solution for the system when the current output is classified as feasible for it, and fails to produce the feasible solution when the current output is classified as infeasible.

The solver having the current output classified as feasible may be selected 214 based on the accuracy of the solver and the computational requirement of the solver. For example, in some example embodiments where only the strong solver returns a feasible solution, the strong solver may be selected by default as it has the maximum accuracy in solving for that instance of the current state. In some scenarios where both the strong and the weak solvers return feasible solutions, the weak solver may be selected as the accuracies of both solvers may be in proximity to each other but the computational requirement of the weak solver is less than that of the strong solver.

Figure 2C:
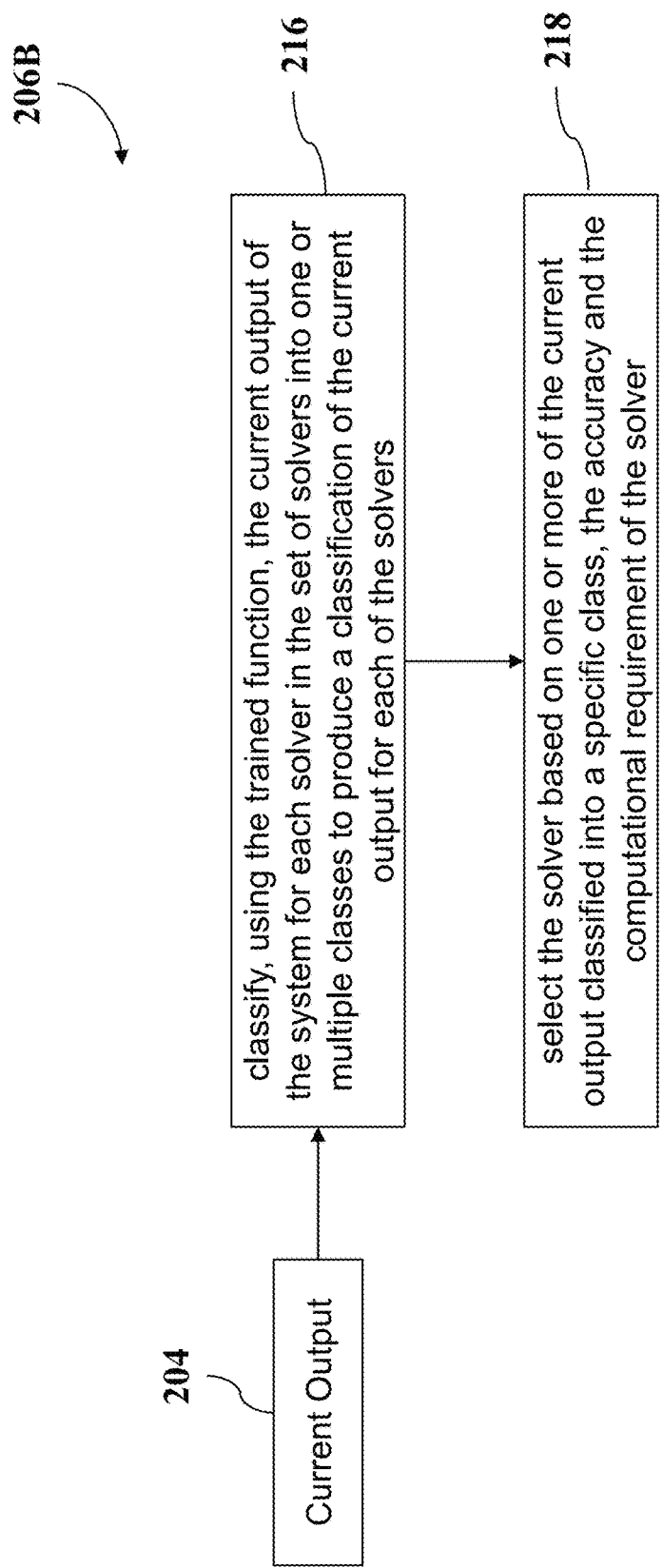
FIG. 2C is a flowchart illustrating another method for selecting a solver from a set of solvers according to some embodiments.

FIG. 2C illustrates another example method 206B for selecting a solver according to some example embodiments. The current output 204 of the system is classified 216 using the classifier/trained function, for each solver in the set of solvers (for example, for both of the weak and strong solvers) into one or multiple classes to produce a classification of the current output for each of the solvers. The classes for classifying the current output include one or a combination of binary or one-hot classification labels.

A solver may be selected 218 based on one or more of the current output classified as feasible or infeasible, the accuracy of the solver and the computational requirement of the solver. For example, in some example embodiments where only the strong solver returns a feasible solution, the strong solver may be selected by default as it has the maximum accuracy in solving for that instance of the current state. In some scenarios where both the strong and the weak solvers return feasible solutions, the weak solver may be selected as the accuracies of both solvers may be in proximity to each other but the computational requirement of the weak solver is less than that of the strong solver.

Solving the optimal control problem, e.g., the MPC problem, at every control cycle can require a significant amount of computation and hence can be too slow to be executed in controllers having limited computational capabilities, or in fast systems where the control is required to be applied often, e.g., every few microseconds. Further, MPC framework can be further extended to hybrid systems with continuous and discrete elements of operations that involve both continuous and discrete variables in the model, objective and/or constraints that describe the dynamics of the system, performance metric and/or objective of control. However, the resulting optimization problems for such systems are highly non-convex, and therefore difficult to solve in practice. Furthermore, selecting the appropriate solver is analytically challenging as well.

Figure 3:
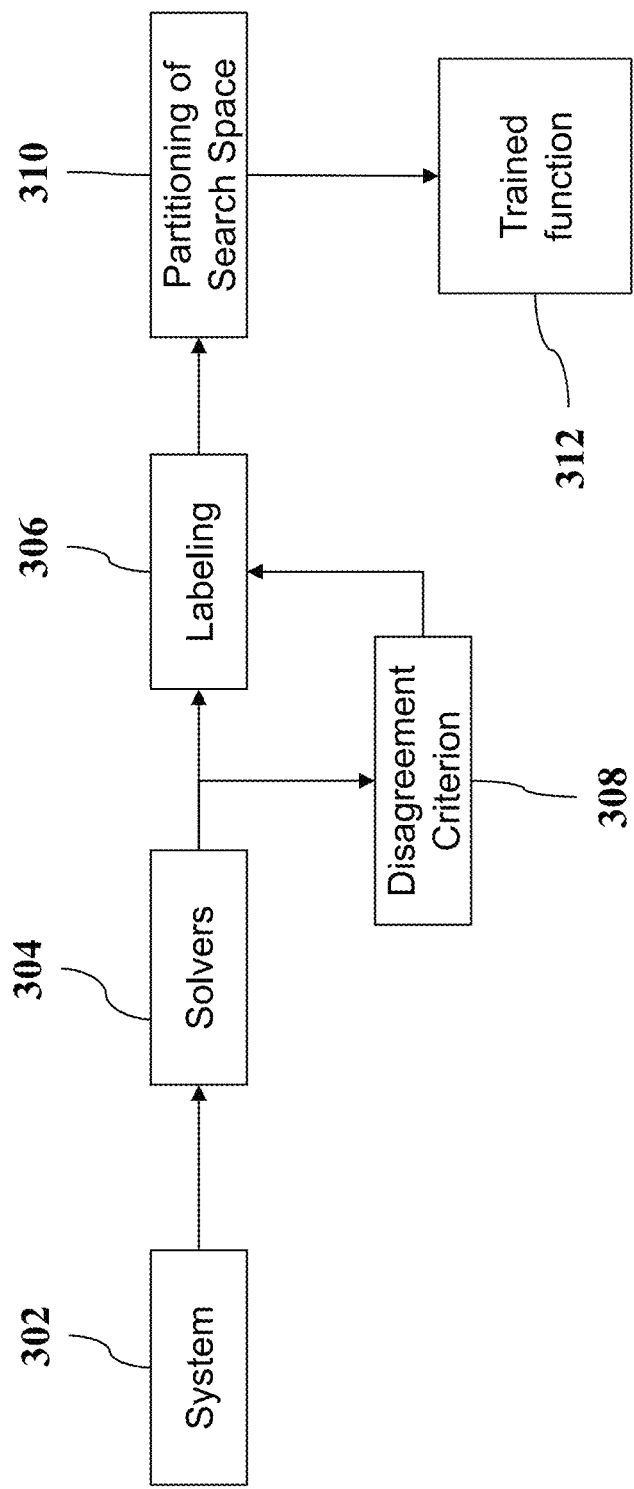
FIG. 3 is an exemplar framework for training a function for solver selection according to some embodiments.

To cater to such challenges, a framework for training a function for solver selection according to some embodiments is illustrated in FIG. 3. Outputs indicating states of the system 302 are provided to solvers that are simulated to provide 304 a solution for each sample state in the manner discussed previously. The solution provided by each solver along with a disagreement criterion 308 defines labels 306 to be assigned to each of the sample states. For example, in case of a strong and a weak solver, the disagreement criterion is determined based on one or a combination of feasibilities of the solutions produced by the strong solver and the weak solver, a distance between the solutions produced by the strong solver and the weak solver, a degree of suboptimality between the strong solver and the weak solver, and a time required to obtain a solution by the strong versus the strong solver.

In order to define the disagreement region in the state search sample, some example embodiments define two MPC control policies. The first MPC policy involves iteratively solving (1a-1e) using the strong solver and applying the first control input of the optimal solution at every time step k. For a simulation horizon of T time steps, this generates a trajectory of states and inputs $\xi^S(\hat{x}_0, T):=\{x_{k+1}^S, u_k^S\}_{k=0}^T$ of the closed-loop system, initialized at $x_0^S=\hat{x}_0$. Another MPC policy is implemented similar to the first, but involves iteratively solving the relaxed MI-MPC problem (2a-2e) based on the weak solver, which yields the trajectory $\xi^W(\hat{x}_0, T):=\{x_{k+1}^W, u_k^W\}_{k=0}^T$, initialized at the same initial state $x_0^W=\hat{x}_0$.

A closed-loop trajectory $\xi^S$ (or $\xi^W$) may be referred to as infeasible if there exists any $k \in Z_0^T$ such that any corresponding constraint in (1a-1e) or (2a-2e), respectively is violated at that time step k. Conversely, a trajectory is feasible if it satisfies constraints for every $k \in Z_0^T$. With this definition in mind, a simulation horizon T>>N may be selected, and the corresponding closed-loop state and input trajectories may be used to partition the admissible state-space X into three regions.

An infeasible region may be defined as $$\overline{X}(T):=\{\hat{x}_0 \in X: \xi^S(\hat{x}_0, T) \text{infeasible}\}, \quad (3a)$$

which comprise initial conditions from which closed-loop trajectories generated by the strong solver are infeasible. A disagreement region is also defined as:

$$X_D(T):=\{\hat{x}_0 \in X: \xi^S(\hat{x}_0, T) \text{feasible}, \xi^W(\hat{x}_0, T) \text{infeasible}\}, \quad (3b)$$

that contains initial states from which only the strong solver can generate feasible closed-loop trajectories, but the weak cannot. What remains is the agreement region, given by $$X_A(T):=\{\hat{x}_0 \in X: \xi^S(\hat{x}_0, T) \text{ and } \xi^W(\hat{x}_0, T) \text{are both feasible}\}, \quad (3c)$$

where both solvers generate feasible closed-loop trajectories. By construction, $X=\overline{X}(T) \cup X_D(T) \cup X_A(T)$, and all sets are mutually disjoint.

Referring to FIG. 3, the labels are assigned to each sample state and a partitioning of the search space is learned 310 to obtain a trained function. The trained function can now be utilized to classify a current state of system 107 and thereby aid in selecting a suitable solver.

As discussed previously, in some example embodiments, the strong solver solves the mixed-integer optimal control optimization problem using a branch-and-bound (B&B) optimization that searches for a global optimal solution within a search space to produce the current control input. FIG. 5 illustrates pseudo code of a branch-and-bound mixed-integer optimization algorithm to search for the integer-feasible optimal control solution based on a nested tree of search regions and corresponding lower/upper bound values.

In one embodiment, the MI-MPC problem at each control time step is solved using a branch-and-bound optimization method and the warm starting information includes data related to the nodes in the binary search tree that are part of the solution path from the root node to the leaf node where the optimal integer-feasible control solution is found, in order to improve the node selection and variable branching strategies from one control time step to the next.

The branch-and-bound method initializes the branching search tree information for the mixed-integer quadratic program (MIQP) at the current control time step 510, based on the MIQP data that consists of MIQP matrices and MIQP vectors. The initialization can additionally use the branching search tree information and MIQP solution information from the previous control time step in order to generate a warm started initialization for the current control time step 510. The main goal of the optimization algorithm is to construct lower and upper bounds on the objective value of the mixed-integer control solution. If the gap between the lower and upper bound value is smaller than a particular tolerance value 511, then the mixed-integer optimal control solution is found.

As long as the gap between the lower and upper bound value is larger than a particular tolerance value 511, and a maximum execution time is not yet reached by the optimization algorithm, then the branch-and-bound method continues to search iteratively for the mixed-integer optimal control solution. Each iteration of the branch-and-bound method starts by selecting the next node in the tree, corresponding to the next region or partition of the integer variable search space, with possible variable fixings based on pre-solve branching techniques 515. After the node selection, the corresponding integer-relaxed MPC problem is solved, with possible variable fixings based on post-solve branching techniques 520.

If the integer-relaxed MPC problem has a feasible solution, then the resulting relaxed control solution provides a lower bound on the objective value for that particular region or partition of the integer variable search space. In case that this lower bound is larger than the currently known upper bound for the objective value of the optimal mixed-integer control solution 521, then the selected node is pruned or removed from the branching tree 540. If the objective is lower than the currently known upper bound 521, and the relaxed control solution is integer feasible 525, then the currently known upper bound and corresponding mixed-integer control solution guess needs to be updated 530.

If the integer-relaxed MPC problem has a feasible solution and the objective is lower than the currently known upper bound 521, but the relaxed control solution is not yet integer feasible, then the global lower bound for the objective can be updated 535 to be the minimum of the objective values for the existing nodes in the branching tree and the selected node is pruned from the tree 540. In addition, starting from the current node, a discrete variable with a fractional value is selected for branching according to a particular branching strategy 545, in order to append the resulting subproblems, corresponding to regions or partitions of the discrete search space, as children of that node in the branching tree 550.

An important step in the branch-and-bound method is how to create the partitions, i.e., which node to select 515 and which discrete variable to select for branching 545. Some embodiments of the invention are based on branching one of the binary control variables with fractional values in the integer-relaxed MPC solution. For example, if a particular binary control variable $u_{i,k} \in \{0, 1\}$ has a fractional value as part of the integer-relaxed MPC solution, then some embodiments create two partitions of the mixed-integer program by adding, respectively, the equality constraint $u_{i,k}=0$ to one subproblem and the equality constraint $u_{i,k}=1$ to the other subproblem.

The branch-and-bound method continues iterating until either one or multiple of termination conditions are satisfied. The termination conditions include the maximum execution time for the processor is reached, all the nodes in the branching search tree have been pruned, such that no new node can be selected for solving convex relaxations or branching, and the optimality gap between the global lower and upper bound value for the objective of the mixed-integer control solution is smaller than the tolerance.

Figure 7A:
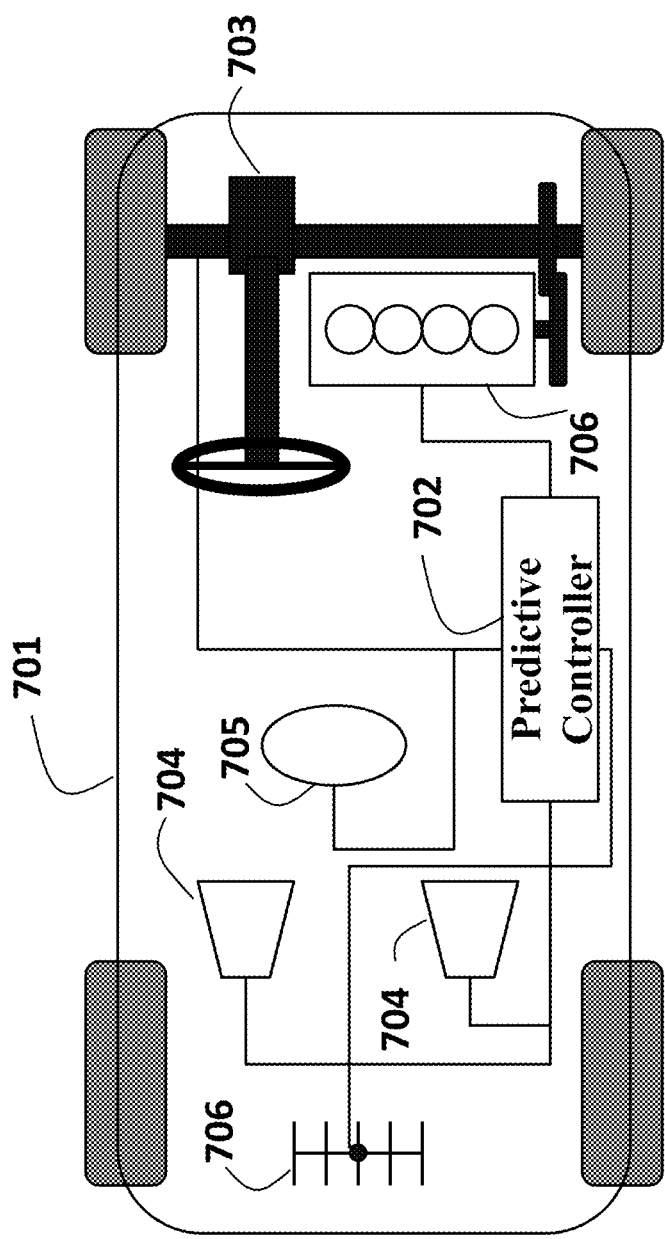
FIG. 7A is a schematic of a vehicle including a controller employing principles of some embodiments.

FIG. 7A shows a schematic of a vehicle 701 including a predictive controller 702 employing principles of some embodiments. As used herein, the vehicle 701 can be any type of wheeled vehicle, such as a passenger car, bus, or rover. Also, the vehicle 701 can be an autonomous or semi-autonomous vehicle. For example, some embodiments control the motion of the vehicle 701. Examples of the motion include lateral motion of the vehicle controlled by a steering system 703 of the vehicle 701. In one embodiment, the steering system 703 is controlled by the controller 702. Additionally, or alternatively, the steering system 703 can be controlled by a driver of the vehicle 701.

The vehicle can also include an engine 706, which can be controlled by the controller 702 or by other components of the vehicle 701. The vehicle can also include one or more sensors 704 to sense the surrounding environment. Examples of the sensors 704 include distance range finders, radars, lidars, and cameras. The vehicle 701 can also include one or more sensors 705 to sense its current motion quantities and internal status. Examples of the sensors 705 include global positioning system (GPS), accelerometers, inertial measurement units, gyroscopes, shaft rotational sensors, torque sensors, deflection sensors, pressure sensor, and flow sensors. The sensors provide information to the controller 702. The vehicle can be equipped with a transceiver 706 enabling communication capabilities of the controller 702 through wired or wireless communication channels.

Figure 7B:
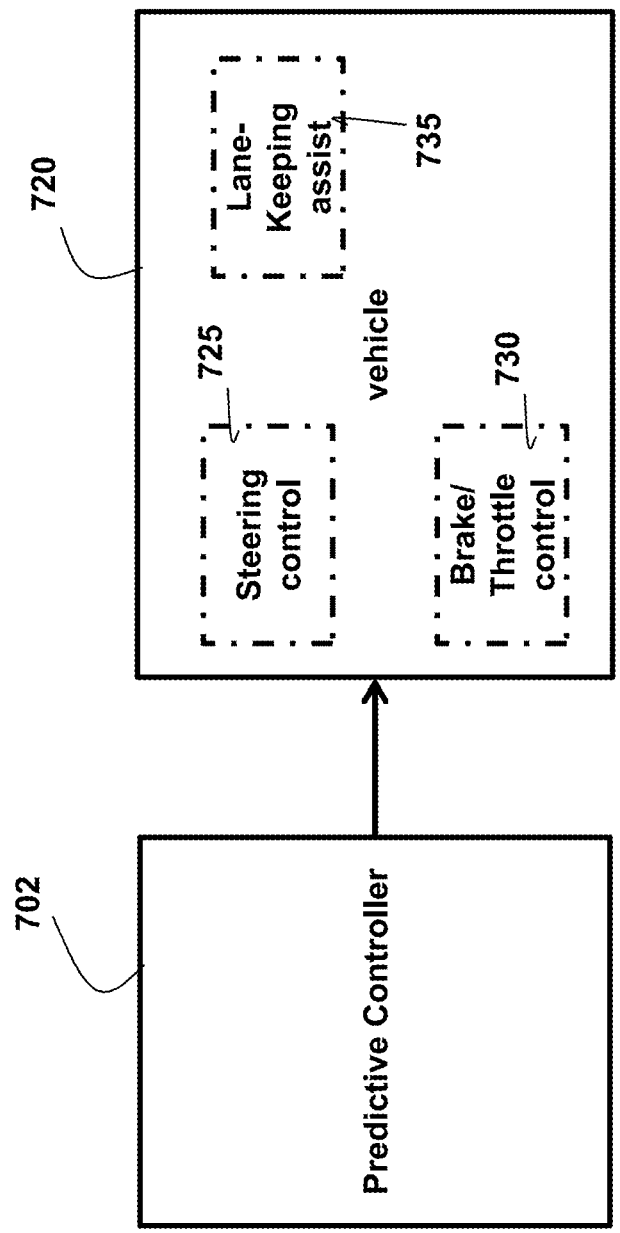
FIG. 7B is a schematic of interaction between the controller employing principles of some embodiments and controllers of a vehicle according to some embodiments.

FIG. 7B shows a schematic of interaction between the predictive controller 702 and the controllers 720 of the vehicle 701 according to some embodiments. For example, in some embodiments, the controllers 720 of the vehicle 701 are steering 725 and brake/throttle controllers 730 that control rotation and acceleration of the vehicle 720. In such a case, the predictive controller 702 outputs control inputs to the controllers 725 and 730 to control the state of the vehicle. The controllers 720 can also include high-level controllers, e.g., a lane-keeping assist controller 735 that further process the control inputs of the predictive controller 702. In both cases, the controllers 720 maps use the outputs of the predictive controller 702 to control at least one actuator of the vehicle, such as the steering wheel and/or the brakes of the vehicle, in order to control the motion of the vehicle.

Figure 7C:
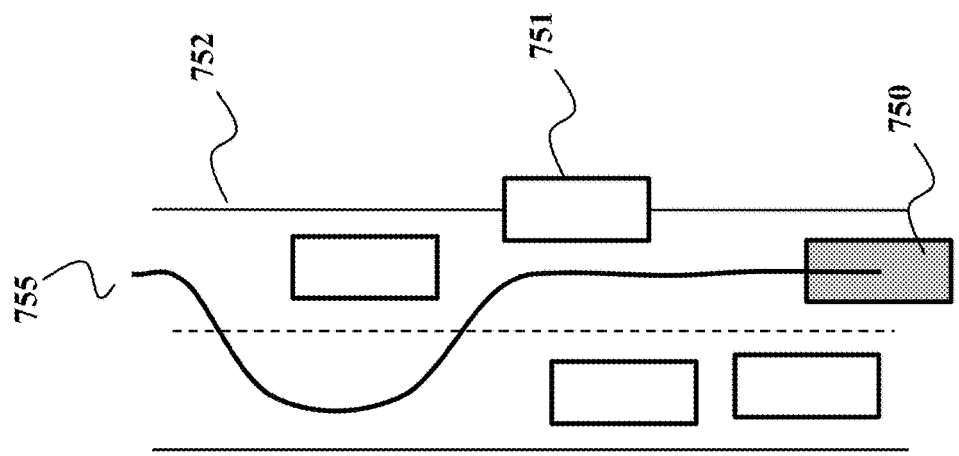
FIG. 7C is a schematic of a path and/or motion planning method for a controlled vehicle employing principles of some embodiments.

FIG. 7C shows a schematic of an autonomous or semi-autonomous controlled vehicle 750 for which a dynamically feasible, and often optimal trajectory 755 can be computed by using embodiments of this invention. The generated trajectory aims to keep the vehicle within particular road bounds 752, and aims to avoid other uncontrolled vehicles, i.e., obstacles 751 for the controlled vehicle 750. In some embodiments, each of the obstacles 751 can be represented by one or multiple inequality constraints in a time or space formulation of the mixed-integer optimal control problem, including one or multiple additional discrete variables for each of the obstacles. For example, based on embodiments configured to implement a mixed-integer model predictive controller, the autonomous or semi-autonomous controlled vehicle 750 can make discrete decisions in real time such as, e.g., pass another vehicle on the left or on the right side or instead to stay behind another vehicle within the current lane of the road 752.

Figure 8A:
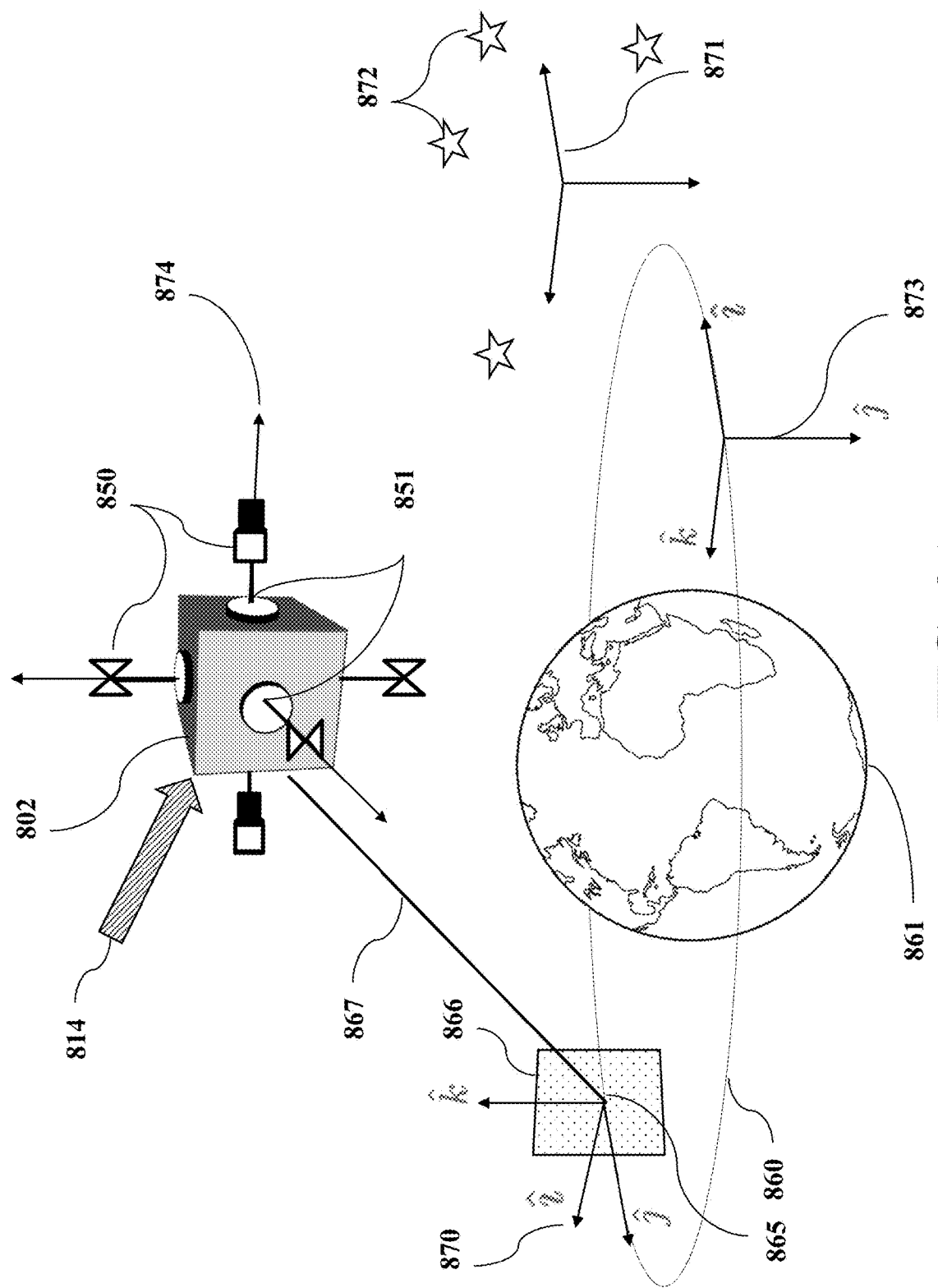
FIGS. 8A and 8B are schematics of a spacecraft mixed-integer predictive control problem formulation employing principles of some embodiments.
Figure 8B:
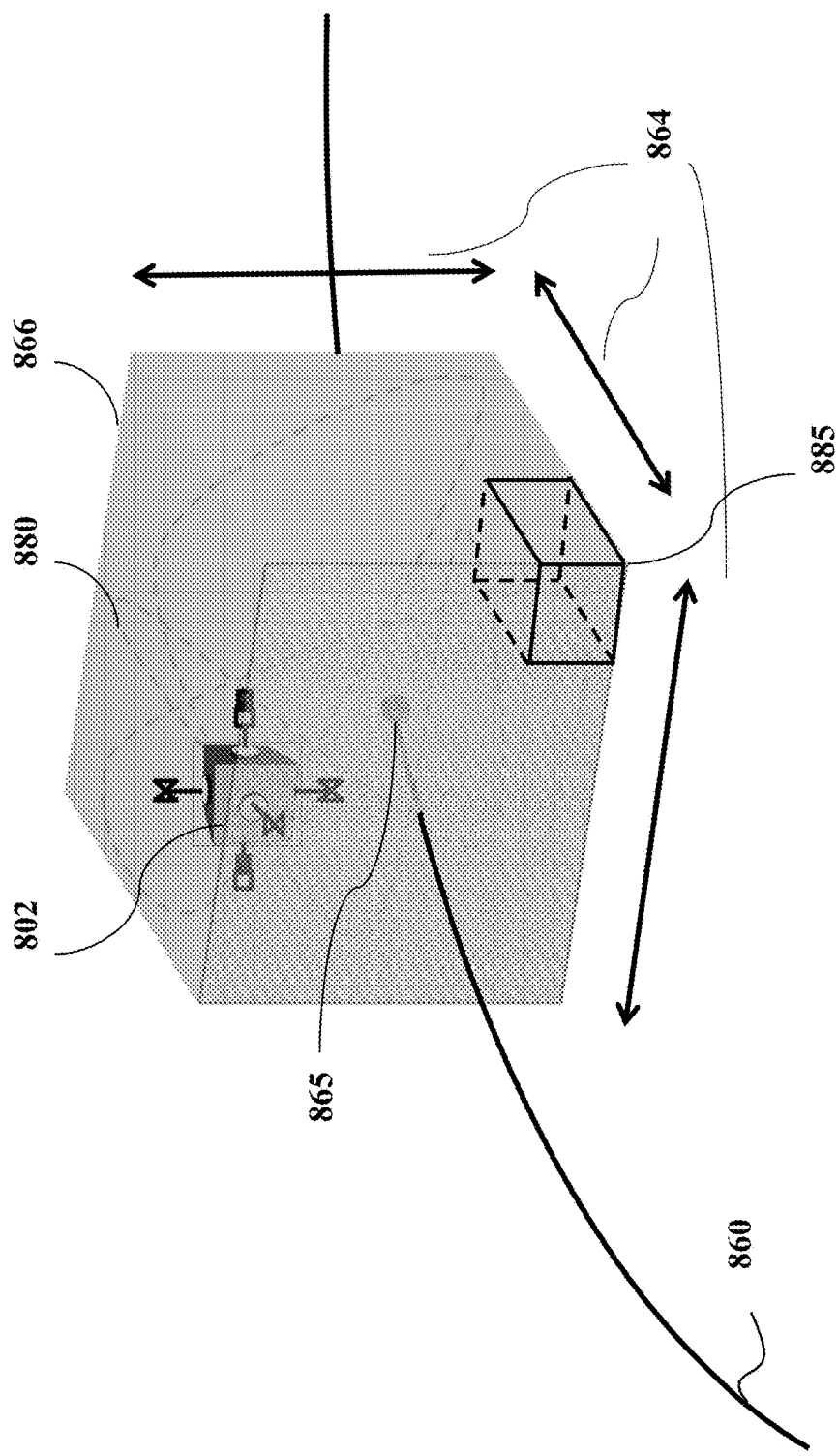

FIGS. 8A and 8B show a spacecraft 802 equipped with a plurality of actuators such as thrusters 850 and momentum exchange devices 851. Examples of the type of momentum exchange devices include reaction wheels (RWs) and gyroscopes. The spacecraft is a vehicle, vessel, or machine designed to fly in outer space whose operation changes quantities such as the position of the spacecraft, its velocities, and its attitude or orientation, in response to commands that are sent to the actuators. When commanded, the actuators impart forces on the spacecraft that increase or decrease the velocity of the spacecraft and thus cause the spacecraft to translate its position, and, when commanded, the actuators also impart torques on the spacecraft, which cause the spacecraft to rotate and thereby change its attitude or orientation. As used herein, the operation of the spacecraft is determined by the operation of the actuators that determine a motion of the spacecraft that changes such quantities.

The spacecraft flies in outer space along an open or closed orbital path 860 around, between, or near one or more gravitational bodies such as the Earth 861, moon, and/or other celestial planets, stars, asteroids, comets. Usually, a desired or target position 865 along the orbital path is given. A reference frame 870 is attached to the desired position, where the origin of the frame, i.e., all zeros coordinates in that reference frame are the coordinates of the desired position at all times.

The spacecraft is subject to various disturbance forces 814. These disturbance forces may include forces that were not accounted for when determining the orbital path for the spacecraft. These disturbance forces act on the spacecraft to move the spacecraft away from the desired position on the orbital path. These forces can include, but are not limited to, gravitational attraction, radiation pressure, atmospheric drag, non-spherical central bodies, and leaking propellant. Thus, the spacecraft can be at a distance 867 away from the target position.

Due to the disturbance forces, it is not always possible to keep the spacecraft at the desired position along its orbit. As such, it is desired that the spacecraft instead remains within a window 866 with specified dimensions 864 around the desired position. To that end, the spacecraft is controlled to move along any path 880 that is contained within the desired target window. In this example, the window 866 has a rectangular shape, but the shape of the window can vary for different embodiments.

The spacecraft is also often required to maintain a desired orientation. For example, a spacecraft-fixed reference frame 874 is required to be aligned with a desired reference frame such as an inertial reference frame 871 that is fixed relative to distant stars 872, or a reference frame 873 that is always oriented in a manner that points towards the Earth. However, depending on the shape of the spacecraft, different disturbance forces 814 can act non-uniformly on the spacecraft, thereby generating disturbance torques, which cause the spacecraft to rotate away from its desired orientation. In order to compensate for the disturbance torques, momentum exchange devices 851 such as reaction wheels are used to absorb the disturbance torques, thus allowing the spacecraft to maintain its desired orientation.

So that the momentum exchange devices do not saturate, and thereby lose the ability to compensate for disturbance torques, their stored momentum must be unloaded, e.g., by reducing spin rates of the reaction wheels. Unloading the momentum exchange devices imparts an undesired torque on the spacecraft. Such an undesired torque is also compensated for by the thrusters.

In some embodiments, the spacecraft can be modeled as a hybrid system and the commands that are sent to the actuators are computed using a predictive controller, such as the mixed-integer model predictive controller. For example, in some embodiments, the commands that are sent to the thrusters 850 can only take a discrete set of values, and therefore resulting into a set of binary or integer control input variables for each stage within the mixed-integer control horizon.

In some embodiments, the predictive controller is designed such that the spacecraft remains outside of a particular zone 885 with specified dimensions, close to the desired position along the orbit. The latter zone can be either fixed in time or it can be time varying, and is often referred to as an exclusion zone 885, for which the corresponding logic inequality constraints can be modeled using an additional set of binary or integer control input variables for each stage within the mixed-integer control horizon. In this example, the exclusion zone 885 has a rectangular shape, and it is positioned in a corner of the desired window 866, but the shape and position of the exclusion zone within the desired target window can vary for different embodiments.

Figure 9A:
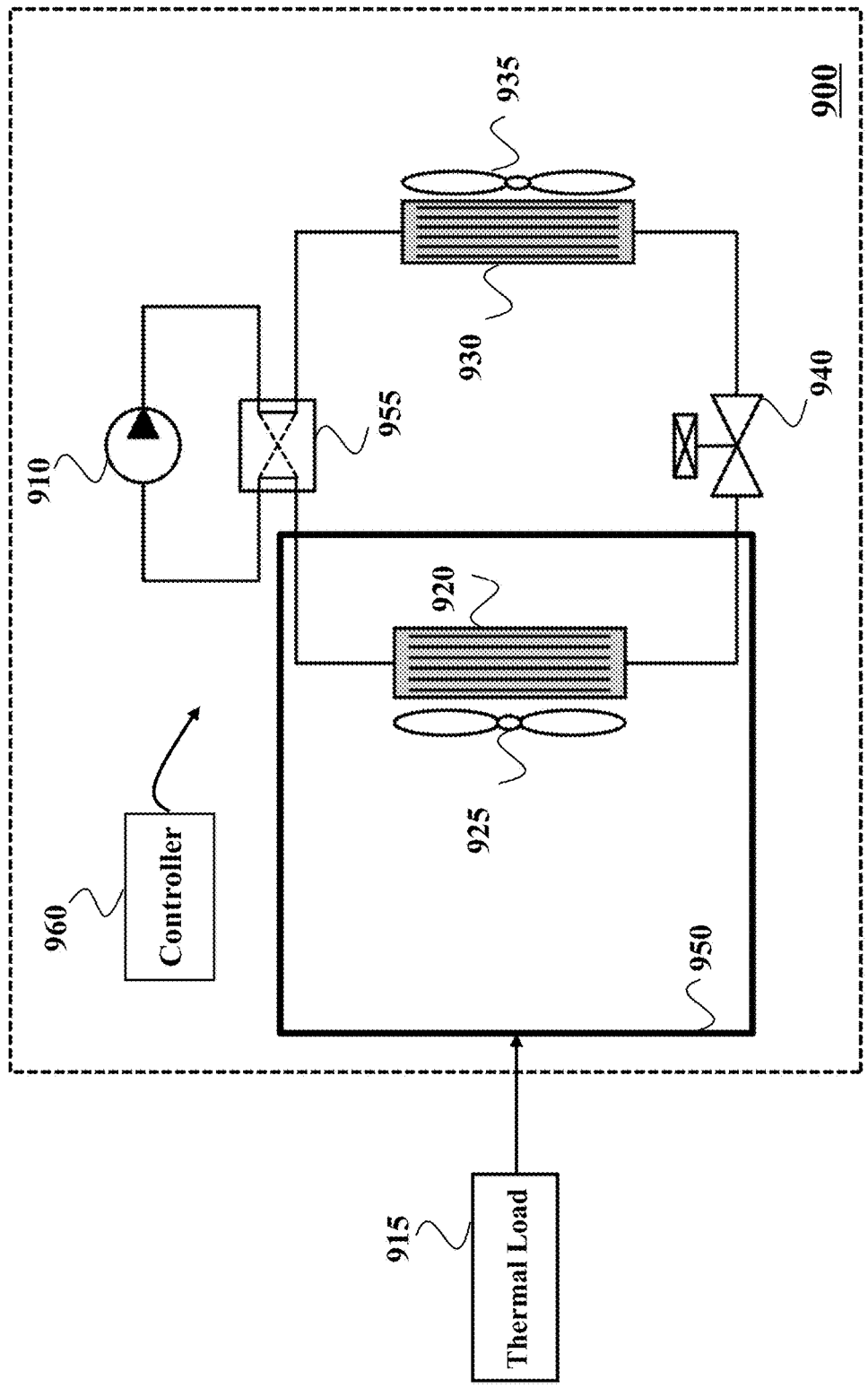
FIGS. 9A and 9B are schematics of a mixed-integer predictive control problem formulation for a vapor compression system (VCS), and an exemplary set of its components, employing principles of some embodiments.

FIG. 9A shows a schematic of a vapor compression system 900 controlled by a controller 960 according to some embodiments of the invention. The controller 960 includes a predictive controller, such as a controller implementing a model predictive control (MPC). The components of the vapor compression system (VCS) 900 can include an indoor heat exchanger 920 located in an indoor space or zone 950, an outdoor unit heat exchanger 930 located in the ambient environment, a compressor 910 and an expansion valve 940. A thermal load 915 acts on the indoor space or zone 950.

Additionally, the VCS 900 can include a flow reversing valve 955 that is used to direct high pressure refrigerant exiting the compressor to either the outdoor unit heat exchanger or the indoor unit heat exchanger, and direct low-pressure refrigerant returning from either the indoor unit heat exchanger or outdoor unit heat exchanger to the inlet of the compressor. In the case where high-pressure refrigerant is directed to the outdoor unit heat exchanger, the outdoor unit heat exchanger acts as a condenser and the indoor unit acts as an evaporator, wherein the system rejects heat from the zone to the ambient environment, which is operationally referred to as "cooling mode." Conversely, in the case where the high-pressure refrigerant is directed to the indoor unit heat exchanger, the indoor unit heat exchanger acts as a condenser and the outdoor unit heat exchanger acts as an evaporator, extracting heat from the ambient environment and pumping this heat into the zone, which is operationally referred to as "heating mode."

Figure 9B:
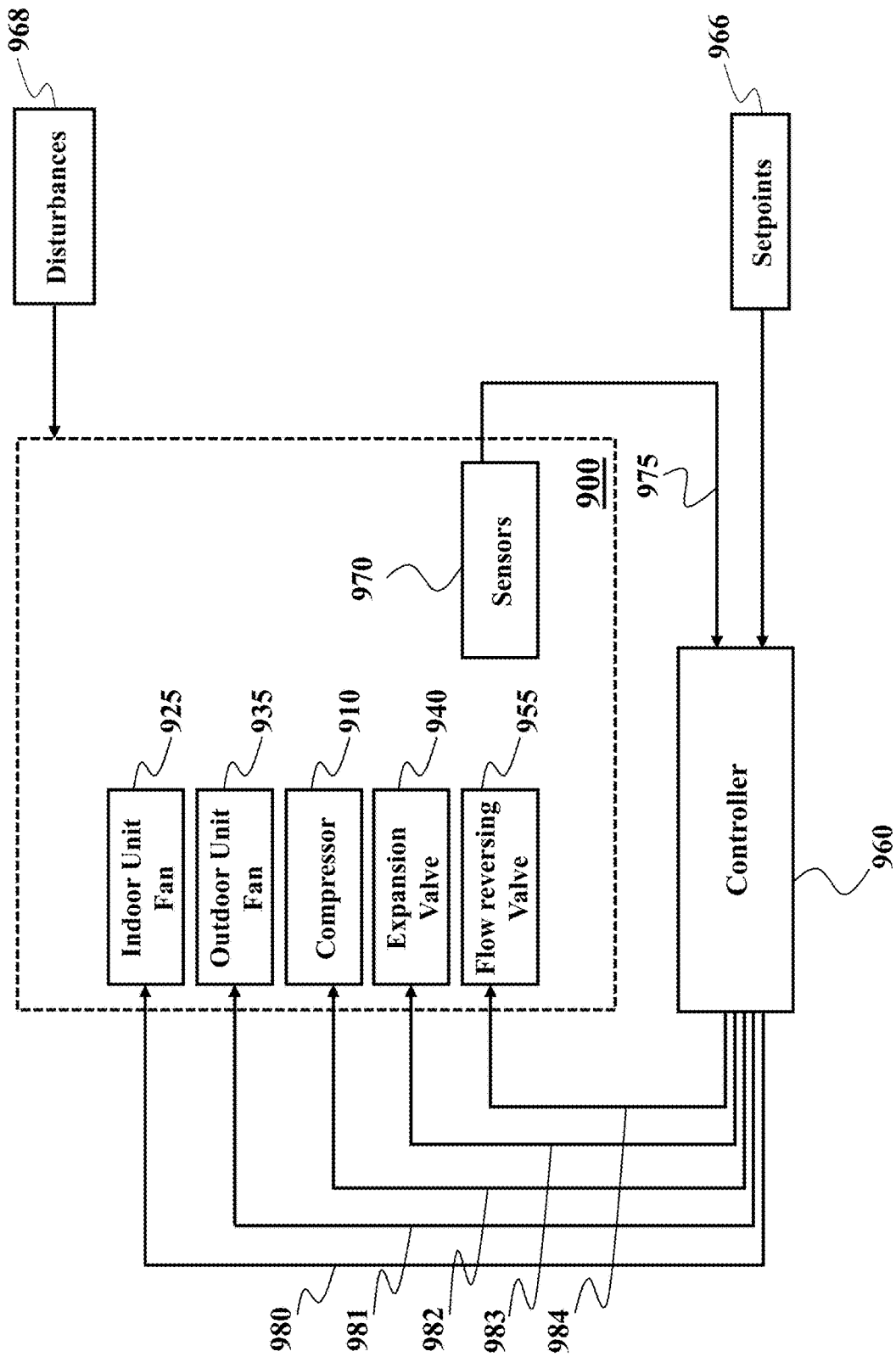

FIG. 9B shows an example of the configuration of signals, sensors, and controller used in the VCS 900. A controller 960 reads information from sensors 970 configured to measure various temperatures, pressures, flow rates or other information about the operation of the system, including measurable disturbances such as the ambient air temperature. The controller can be provided with setpoints 966 that represent desired values of measured signals of the process such as a desired zone temperature. Setpoint information can come from a thermostat, wireless remote control, or internal memory or storage media. The controller then computes control inputs such that some measured outputs are driven to their setpoints. These control inputs can include an indoor unit fan speed 980, an outdoor unit fan speed 981, a compressor rotational speed 982, an expansion valve position 983, and a flow reversing valve position 984. In this manner, the controller controls operation of the vapor compression system such that the setpoint values are achieved in the presence of disturbances 968, such as a thermal load, acting on the system.

In some embodiments, the VCS can be modeled as a hybrid system and the commands that are sent to the actuators are computed using a predictive controller, such as the mixed-integer model predictive controller. For example, in some embodiments, the commands that are sent to the valves and/or the fans can only take a discrete set of values, and therefore resulting into a set of binary or integer control input variables for each stage within the mixed-integer control horizon.

In some embodiments, the dynamic behavior of the VCS can change rapidly or even switch at certain time instances, depending on the current state of the system and the current control input values. The resulting hybrid VCS system with switching dynamics can be modeled using an additional set of binary or integer control input variables for each stage within the mixed-integer control horizon.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A predictive controller for controlling a system, the predictive controller comprising:
   memory having instructions stored thereon; and
   a processor configured to execute the instructions to cause the predictive controller, for each of control steps, to:
      accept a feedback signal including a current output of the system indicative of a current state of the system;
      classify the current output, using a trained function of the current output, for each solver in a set of solvers into one or multiple classes to produce a classification of the current output for each of the solvers, wherein each solver in the set of solvers is configured to solve an optimization problem by spending computational resources of the processor to produce a solution with an accuracy associated with the solver;
      select a solver in the set of solvers based on one or a combination of the classification of the current output for the solver, the accuracy of the solver, and the computational requirement of the solver;
      solve an optimal control optimization problem using the selected solver to produce a current control input, such that for at least some different control steps, the predictive controller solves a formulation of the optimal control optimization problem with different solvers having different accuracies, requiring different computational resources, or both; and
      submit the current control input to the system thereby changing the current state of the system.

2. The controller of claim 1, wherein the predictive controller is a model predictive controller configured to solve the optimal control optimization problem over a prediction horizon for each of the control steps, wherein the set of solvers includes a strong solver and a weak solver, wherein the accuracy of the solution produced by the strong solver over a larger number of iterations is greater than the accuracy of the solution produced by the weak solver over a smaller number of iterations.

3. The controller of claim 2, wherein the optimal control optimization problem is a mixed-integer finite horizon optimal control optimization problem whose solution yields mixed integer MPC control actions.

4. The controller of claim 3, wherein the strong solver solves the mixed-integer optimal control optimization problem using a branch-and-bound (B&B) optimization that searches for a global optimal solution within a search space to produce the current control input, and wherein the weak solver solves a relaxation of the B&B optimization, such that the computational resource required by the strong solver to solve the mixed-integer optimal control optimization problem is greater than the computational resource required by the weak solver to solve the mixed-integer optimal control optimization problem.

5. The controller of claim 4, wherein the trained function is trained with training data comprising samples of a search space for the outputs of the system labeled with a disagreement criterion between solutions of the optimization problem produced by the strong solver and the weak solver for the system at the states indicated by the sampled outputs.

6. The controller of claim 5, wherein the disagreement criterion is determined based on one or a combination of feasibilities of the solutions produced by the strong solver and the weak solver, a distance between the solutions produced by the strong solver and the weak solver, a degree of suboptimality between the strong solver and the weak solver, and a time required to obtain a solution by the strong versus the strong solver.

7. The controller of claim 1, wherein the set of solvers include an exact solver, a heuristic solver, a rounding scheme solver, a feasibility pump solver, an approximate optimization solver, a learning-based solver, and a multi-parametric/explicit model predictive control (MPC) solver.

8. The controller of claim 1, wherein the classes for classifying the current output include one or a combination of binary or one-hot classification labels.

9. The controller of claim 8, wherein the trained function is trained with training data comprising samples of a search space for the outputs of the system labeled with classes of solutions determined by each solver by solving the optimization problem for the system at the states indicated by the sampled outputs.

10. The controller of claim 1, wherein the trained function is trained with training data comprising samples of a search space for the outputs of the system labeled a disagreement criterion determined by each solver by solving the optimization problem for the system at the states indicated by the sampled outputs.

11. The controller of claim 1, further comprising:
a transceiver configured to submit a sequence of control inputs to the system thereby changing the states of the system and receive the feedback signal including a corresponding sequence of outputs of the system indicative of the state of the system caused by the corresponding control input.

12. The controller of claim 1, wherein the system includes one or a combination of an air conditioning system, an automobile system, or a spacecraft.

13. A method for controlling a system, comprising:
accepting, by a predictive controller, a feedback signal including a current output of the system indicative of a current state of the system;
selecting, using a trained function of the current output, a solver from a set of solvers, wherein each solver in the set of solvers is configured to solve an optimization problem by spending computational resources of the processor to produce a solution with an accuracy associated with the solver, and wherein the trained function is trained with training data comprising samples of a search space for the outputs of the system, with each sample labeled with a disagreement criterion determined by a solver of the set of solvers by solving the optimization problem for the system at the states indicated by the sampled outputs;
solving an optimal control optimization problem using the selected solver to produce a current control input, such that for at least some different control steps, the predictive controller solves a formulation of the optimal control optimization problem with different solvers having different accuracies, requiring different computational resources, or both; and
submitting the current control input to the system thereby changing the current state of the system.

14. The method of claim 13, wherein the predictive controller is a model predictive controller (MPC) and the optimal control optimization problem is a mixed-integer optimal control optimization problem solved by the MPC over a prediction horizon for each of the control steps, wherein the set of solvers includes a strong solver and a weak solver, wherein the accuracy of the solution produced by the strong solver over a larger number of iterations is greater than the accuracy of the solution produced by the weak solver over a smaller number of iterations.

15. The method of claim 14, wherein the strong solver solves the mixed-integer optimal control optimization problem using a branch-and-bound (B&B) optimization that searches for a global optimal solution within a search space to produce the current control input, and wherein the weak solver solves a relaxation of the B&B optimization, such that the computational resource required by the strong solver to solve the mixed-integer optimal control optimization problem is greater than the computational resource required by the weak solver to solve the mixed-integer optimal control optimization problem.

16. The method of claim 13, wherein selecting the solver comprises:
classifying, using the trained function, the current output of the system for each solver in the set of solvers into a feasible class or an infeasible class, wherein a solver produces a feasible solution for the system having the current output classified as feasible and fails to produce the feasible solution for the system having the current output classified as infeasible; and
selecting the solver having the current output classified as feasible based on the accuracy and the computational requirement of the solver.

17. The method of claim 13, wherein selecting the solver comprises:
classifying, using the trained function, the current output of the system for each solver in the set of solvers into one or multiple classes to produce a classification of the current output for each of the solvers; and
selecting the solver based on one or a combination of the classification of the current output for the solver, the accuracy of the solver, and the computational requirement of the solver.

18. A non-transitory computer readable storage medium having embodied thereon a program executable by a processor for performing a method of controlling a system by a predictive controller, the method comprising:
accepting a feedback signal including a current output of the system indicative of a current state of the system;
classifying the current output, using a trained function of the current output, for each solver in a set of solvers into a feasible class or an infeasible class, wherein a solver of the set of solvers produces a feasible solution for the system having the current output classified as feasible and fails to produce the feasible solution for the system having the current output classified as infeasible, and wherein each solver in the set of solvers is configured to solve an optimization problem by spending computational resources of the processor to produce a solution with an accuracy associated with the solver;
selecting a solver in the set of solvers that has the current output classified as feasible based on the accuracy of the solver and the computational requirement of the solver;
solving an optimal control optimization problem using the selected solver to produce a current control input, such that for at least some different control steps, the predictive controller solves a formulation of the optimal control optimization problem with different solvers having different accuracies, requiring different computational resources, or both; and submitting the current control input to the system thereby changing the current state of the system.

\* \* \* \* \*